US012751122B2

(12) United States Patent
Wang et al.

(10) Patent No.: US 12,751,122 B2
(45) Date of Patent: Sep. 29, 2026

(54) WIRING SUBSTRATE AND METHOD OF MANUFACTURING THE SAME, BACKBOARD AND DISPLAY APPARATUS

(71) Applicants: Hefei BOE Ruisheng Technology Co., Ltd., Hefei (CN); BOE TECHNOLOGY GROUP CO., LTD., Beijing (CN)

(72) Inventors: Jie Wang, Beijing (CN); Zouming Xu, Beijing (CN); Xintao Wu, Beijing (CN); Zhi Jin, Beijing (CN); Tao Luo, Beijing (CN); Ningyu Luo, Beijing (CN); Tingwei Han, Beijing (CN)

(73) Assignees: Hefei BOE Ruisheng Technology Co., Ltd., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 687 days.

(21) Appl. No.: 18/254,402

(22) PCT Filed: May 31, 2022

(86) PCT No.: PCT/CN2022/096478

§ 371 (c)(1),
(2) Date: May 25, 2023

(87) PCT Pub. No.: WO2023/230923

PCT Pub. Date: Dec. 7, 2023

(65) Prior Publication Data

US 2024/0372051 A1 Nov. 7, 2024

(51) Int. Cl.
*H10H 20/857* (2025.01)
*G02F 1/13357* (2006.01)
(Continued)

(52) U.S. Cl.
CPC ..... *H10H 20/857* (2025.01); *G02F 1/133603* (2013.01); *H10H 20/0364* (2025.01); *H10W 90/00* (2026.01)

(58) Field of Classification Search
CPC .. H10H 20/857; H10H 20/0364; H10H 29/49; H10H 29/857; G02F 1/133603;
(Continued)

(56) References Cited

U.S. PATENT DOCUMENTS

2011/0061232 A1* 3/2011 Kawamura .......... H05K 3/3478 29/832
2012/0247823 A1 10/2012 Kasai et al.
(Continued)

FOREIGN PATENT DOCUMENTS

CN 102316668 A 1/2012
CN 205946344 U 2/2017
(Continued)

OTHER PUBLICATIONS

Extended European Search Report for corresponding Application No. 22944259.5, dated Sep. 2, 2025, 9 pages.
(Continued)

*Primary Examiner* — Victor A Mandala
(74) *Attorney, Agent, or Firm* — Dority & Manning, P.A.

(57) ABSTRACT

A wiring substrate includes a substrate, at least one conductive layer located on a side of the substrate, and a protective layer located on a side of the at least one conductive layer. A conductive layer includes a plurality of pad groups, and a pad group includes a plurality of conductive pads. The
(Continued)

protective layer includes a plurality of openings; a portion of the conductive layer exposed by an opening is a conductive pad. A maximum dimension of the conductive pad in a direction parallel to the substrate is greater than or equal to 1.5 times a minimum distance between an edge of the conductive pad and an edge of the conductive layer, and less than or equal to 30 times the minimum distance between the edge of the conductive pad and the edge of the conductive layer.

19 Claims, 15 Drawing Sheets

(51) Int. Cl.
*H10H 20/01* (2025.01)
*H10W 90/00* (2026.01)

(58) Field of Classification Search
CPC ...... H01L 25/0753; H05K 3/28; H05K 1/111; H10W 90/00
See application file for complete search history.

(56) References Cited

U.S. PATENT DOCUMENTS

| | | | | |
|---|---|---|---|---|
| 2016/0307862 | A1* | 10/2016 | Lin | H10W 20/063 |
| 2018/0061995 | A1 | 3/2018 | Kimura et al. | |
| 2022/0130747 | A1* | 4/2022 | Wang | H10H 20/857 |

FOREIGN PATENT DOCUMENTS

| | | | |
|---|---|---|---|
| CN | 107761079 | A | 3/2018 |
| CN | 108990266 | A | 12/2018 |
| CN | 110267455 | A | 9/2019 |
| CN | 114156396 | A | 3/2022 |
| JP | 2003110134 | A | 4/2003 |
| JP | 2005136430 | A | 5/2005 |
| JP | 2006024858 | A | 1/2016 |
| KR | 20200033662 | A | 3/2020 |
| TW | 511777 | U | 11/2002 |

OTHER PUBLICATIONS

Korean Office Action (with English translation) for corresponding Application No. KR 10-2024-7042575, dated Dec. 9, 2025, 26 pages.

* cited by examiner

WIRING SUBSTRATE AND METHOD OF MANUFACTURING THE SAME, BACKBOARD AND DISPLAY APPARATUS

CROSS-REFERENCE TO RELATED APPLICATION

This application is a national phase entry under 35 USC 371 of International Patent Application No. PCT/CN2022/096478, filed on May 31, 2022, which is incorporated herein by reference in its entirety.

TECHNICAL FIELD

The present disclosure relates to the field of display technologies, and in particular, to a wiring substrate and a method of manufacturing the same, a backboard and a display apparatus.

BACKGROUND

Mini light-emitting diode (Mini LED) display apparatuses or micro light-emitting diode (Micro LED) display apparatuses have relatively good application prospects due to their advantages of high luminance, clear display image, low power consumption and the like.

SUMMARY

In an aspect, a wiring substrate is provided. The wiring substrate includes a substrate, at least one conductive layer and a protective layer. The at least one conductive layer is located on a side of the substrate. A conductive layer includes a plurality of pad groups, and a pad group includes a plurality of conductive pads. The protective layer is located on a side of the at least one conductive layer away from the substrate. The protective layer includes a plurality of openings; a portion of the conductive layer exposed by an opening is a conductive pad. A maximum dimension of the conductive pad in a direction parallel to the substrate is greater than or equal to 1.5 times a minimum distance between an edge of the conductive pad and an edge of the conductive layer, and less than or equal to 30 times the minimum distance between the edge of the conductive pad and the edge of the conductive layer.

In some embodiments, the maximum dimension of the conductive pad in the direction parallel to the substrate is 0.5 to 5 times a distance between the conductive pad and a conductive pad adjacent thereto.

In some embodiments, the maximum dimension of the conductive pad in the direction parallel to the substrate is greater than or equal to 105 μm, and less than or equal to 350 μm.

In some embodiments, an area of the conductive pad is greater than or equal to 5000 $\mu m^2$, and less than or equal to 55000 $\mu m^2$.

In some embodiments, of a same pad group, a distance between two adjacent conductive pads is greater than or equal to 70 μm, and less than or equal to 214 μm.

In some embodiments, the at least one conductive layer includes a plurality of conductive lines, and a portion of a conductive line exposed by the opening is the conductive pad. The conductive line includes a main surface and a side surface connected to the main surface, and the main surface is a surface of the conductive line away from the substrate; an included angle between the main surface and the side surface is greater than or equal to 105°, and less than or equal to 145°.

In some embodiments, the at least one conductive layer includes a plurality of conductive lines, and a portion of a conductive line exposed by the opening is the conductive pad. The conductive line includes a main surface, and a plurality of side surfaces that are each connected to the main surface, and the main surface is a surface of the conductive line away from the substrate; at least two side surfaces, that each have a small distance to the conductive pad of the conductive line, of the plurality of side surfaces are each a first side surface, and two first side surfaces are connected to each other via a curved surface.

In some embodiments, an orthographic projection of the curved surface on the substrate is a first rounded corner, and a radius of the first rounded corner is greater than or equal to 20 μm, and less than or equal to 30 μm.

In some embodiments, the wiring substrate includes a plurality of device regions. The plurality of pad groups include a plurality of first pad groups and a single second pad group that are located in any device region, the first pad groups each include a first electrode pad and a second electrode pad that are spaced apart from each other, and the second pad group includes at least a power supply pad, a grounding pad, an address pad and an output pad that are arranged at intervals. The wiring substrate includes a source voltage line and a driving voltage line. The power supply pad is electrically connected to the source voltage line, and the address pad is electrically connected to an output pad in another device region; of the plurality of first pad groups, a first electrode pad of a first first pad group is electrically connected to the driving voltage line, a second electrode pad of a former first pad group is electrically connected to a first electrode pad of a latter first pad group, and a second electrode pad of a last first pad group is electrically connected to the output pad. A maximum dimension, in the direction parallel to the substrate, of at least a pad of at least the first electrode pad of the first first pad group, the power supply pad and the grounding pad is less than or equal to 30 times a minimum distance between an edge of the pad and the edge of the conductive layer.

In some embodiments, the wiring substrate includes a plurality of device sub-regions and a single control region. The plurality of pad groups include first pad groups located in any device sub-region, and the first pad groups each include a first electrode pad and a second electrode pad that are spaced apart from each other. The plurality of pad groups further include a second pad group located in the control region, and the second pad group includes a power supply pad, a grounding pad, an address pad and an output pad. The wiring substrate includes a source voltage line and a driving voltage line; the power supply pad is electrically connected to the source voltage line. Of the first pad groups, a first electrode pad of a first first pad group is electrically connected to the driving voltage line, a second electrode pad of a former first pad group is electrically connected to a first electrode pad of a latter first pad group, and a second electrode pad of a last first pad group is electrically connected to the output pad. A maximum dimension of at least the first electrode pad of the first first pad group in the direction parallel to the substrate is less than or equal to 30 times a minimum distance between an edge of the first electrode pad and the edge of the conductive layer.

In some embodiments, the at least one conductive layer includes two conductive layers. A first conductive layer is located on the side of the substrate, and a part of the conductive lines are located in the first conductive layer. A second conductive layer is located on a side of the first conductive layer away from the substrate, and another part of the conductive lines are located in the second conductive layer. A conductive line in the first conductive layer is connected to at least one conductive line located in the second conductive layer through a via hole, and a portion, exposed by the opening, of a conductive line located in the second conductive layer is the conductive pad.

In some embodiments, the wiring substrate further includes an oxidation prevention layer and a conductive functional layer. The oxidation prevention layer covers a side of the conductive pad away from the substrate. The conductive functional layer covers a side of the oxidation prevention layer away from the substrate.

In another aspect, a backboard is provided. The backboard includes a plurality of functional elements, at least one driving chip and the wiring substrate that is as described in any one of the above embodiments. The plurality of pad groups in the wiring substrate include a first pad group and a second pad group, the first pad group is connected to a functional element, and the second pad group is connected to a driving chip.

In yet another aspect, a display apparatus is provided. The display apparatus includes a backlight module and a liquid crystal display panel. The backlight module is the backboard as described in the above embodiments, and the functional elements each include a light-emitting diode. The liquid crystal display panel is located on a light exit side of the backlight module.

In yet another aspect, a display apparatus is provided. The display apparatus includes a display panel including the backboard as described in the above embodiments.

In yet another aspect, a method of manufacturing a wiring substrate is provided. The method of manufacturing the wiring substrate includes: forming a conductive layer on a substrate, the conductive layer including a plurality of pad groups, a pad group including a plurality of conductive pads; forming a protective layer on a side of the conductive layer away from the substrate; and forming openings in the protective layer. A portion of the conductive layer exposed by an opening is a conductive pad; a maximum dimension of the conductive pad in a direction parallel to the substrate is less than or equal to 30 times a minimum distance between an edge of the conductive pad and an edge of the conductive layer.

In some embodiments, the maximum dimension of the conductive pad in the direction parallel to the substrate is greater than or equal to 1.5 times the minimum distance between the edge of the conductive pad and the edge of the conductive layer.

In some embodiments, a step of forming the conductive layer on the substrate includes: depositing a conductive material on the substrate to form an initial conductive layer; forming a photoresist layer on a side of the initial conductive layer away from the substrate; baking the photoresist layer at a specified temperature, the specified temperature being greater than or equal to 125° C., and less than or equal to 135° C.; performing exposure and development on the photoresist layer to pattern the photoresist layer; and etching the initial conductive layer based on the patterned photoresist layer to form the conductive layer.

In some embodiments, in a step of forming the protective layer on the side of the conductive layer away from the substrate, the protective layer is formed by chemical vapor deposition.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1A:
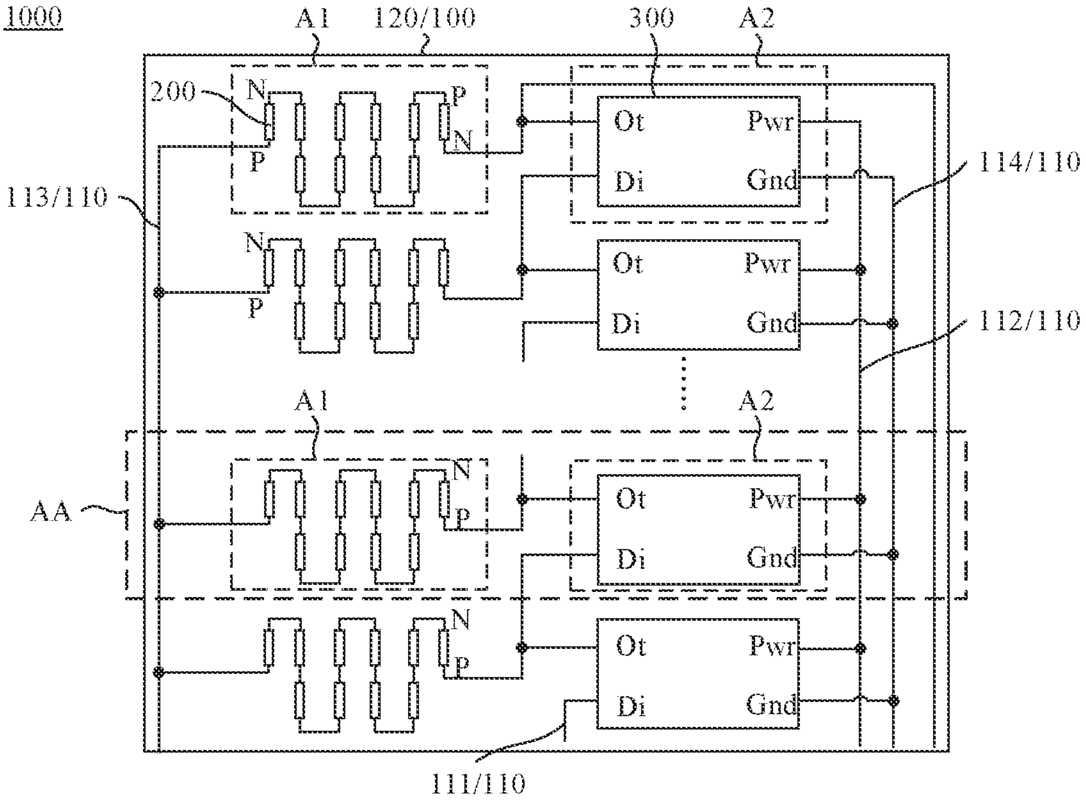
FIG. 1A is a structural diagram of a backboard, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "some embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms such as "connected" and derivatives thereof may be used. For example, the term "connected" may be used in the description of some embodiments to indicate that two or more components are in direct physical or electrical contact with each other.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "configured to" as used herein indicates an open and inclusive expression, which does not exclude devices that are applicable to or configured to perform additional tasks or steps.

Additionally, the phase "based on" as used herein is meant to be open and inclusive, since a process, a step, a calculation or other action that is "based on" one or more of stated conditions or values may, in practice, be based on additional conditions or values beyond those stated.

As used herein, the term such as "about" or "substantially" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term such as "parallel" or "equal" includes a stated condition and a condition similar to the stated condition, a range of the similar condition is within an acceptable range of deviation, and the acceptable range of deviation is determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "equal" includes absolute equality and approximate equality, and an acceptable range of deviation of the approximate equality may be that, for example, a difference between the two that are equal is less than or equal to 5% of either of the two.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

FIG. 1A is a structural diagram of a backboard 1000, in accordance with some embodiments.

Referring to FIG. 1A, some embodiments of the present disclosure provide a backboard 1000, and the backboard 1000 includes a wiring substrate 100, a plurality of functional elements 200 and at least one driving chip 300. The plurality of functional elements 200 and the at least one driving chip 300 are all electrically connected to the wiring substrate 100. The wiring substrate 100 is provided with a plurality of conductive lines 110 therein, and an electrical connection between functional elements 200 and an electrical connection between a functional element 200 and a driving chip 300 may be each achieved by a conductive line 110.

It will be noted that, in addition to the functional elements 200 and the driving chip(s) 300, the backboard 1000 may further include other electronic elements (not shown in the figure) such as a sensor chip, a capacitor, a resistor and an inductor.

Referring to FIG. 1A, in some examples, the plurality of conductive lines 110 in the wiring substrate 100 include a source address line 111, a source voltage line 112, a driving voltage line 113 and a common voltage line 114.

Figure 1B:
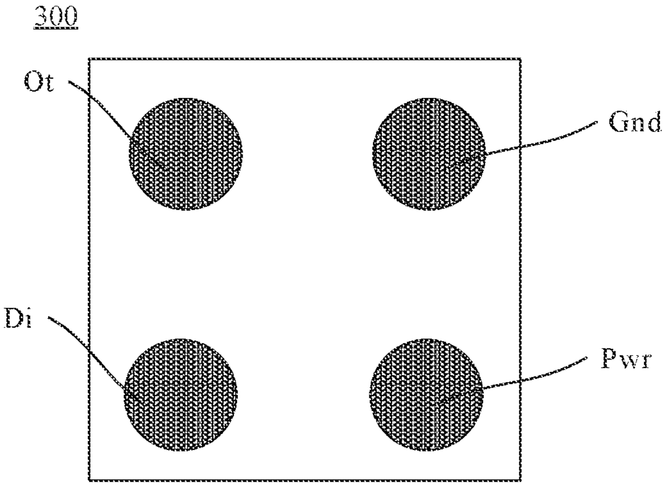
FIG. 1B is a structural diagram of a driving chip, in accordance with some embodiments.

FIG. 1B is a structural diagram of a driving chip 300, in accordance with some embodiments.

Referring to FIG. 1B, in some examples, the driving chip 300 includes a power supply pin Pwr, a grounding pin Gnd, an address pin Di and an output pin Ot.

With continued reference to FIG. 1A, the source address line 111 is connected to the address pin Di of the driving chip 300. The source address line 111 is configured to transmit a first input signal including an address signal, so as to gate the driving chip 300 of the respective address. For example, an address of a different driving chip 300 may be the same or different. The first input signal may be a digital signal having a bit width of 8 bits and including address information, and an address to be transmitted may be obtained by analyzing the first input signal.

The source voltage line 112 is connected to the power supply pin Pwr of the driving chip 300. The source voltage line 112 is configured to transmit a second input signal including a power supply signal and/or a carrier communication signal, so as to provide electric energy for the driving chip 300 and/or transmit communication data to the driving chip 300. For example, the second input signal includes both the power supply signal and the carrier communication signal, so that the second input signal not only provides the electric energy for the driving chip 300, but also transmits the communication data to the driving chip 300; the communication data may be used for controlling an operating state of a respective functional element 200.

The driving voltage line 113 is connected to the output pin Ot of the driving chip 300. A circuit in which the driving voltage line 113 is connected to the output pin Ot of the driving chip 300 is provided with functional elements 200 therein. The driving voltage line 113 is configured to transmit a driving voltage, so as to provide operating voltages for the functional elements 200. The output pin Ot of the driving chip 300 may provide a driving signal and/or a relay signal. For example, the driving signal is used for controlling operating states of the functional elements 200, and the relay signal is used for providing the first input signal for another driving chip 300.

The common voltage line 114 is connected to the grounding pin Gnd of the driving chip 300. The common voltage line 114 is configured to receive and transmit a common voltage signal, and the common voltage signal includes a grounding signal.

Referring to FIG. 1A, in some examples, the backboard 1000 includes a plurality of device regions AA, and a device region AA includes a control region A2 and at least one device sub-region A1 connected to the control region A2. The device sub-region A1 is provided with functional elements therein, and the control region A2 is provided with a driving chip 300 therein. That is, a device region AA is provided with functional elements 200 and a driving chip 300 therein. The driving chip 300 is used for controlling operating states of the functional elements 200.

Figure 1C:
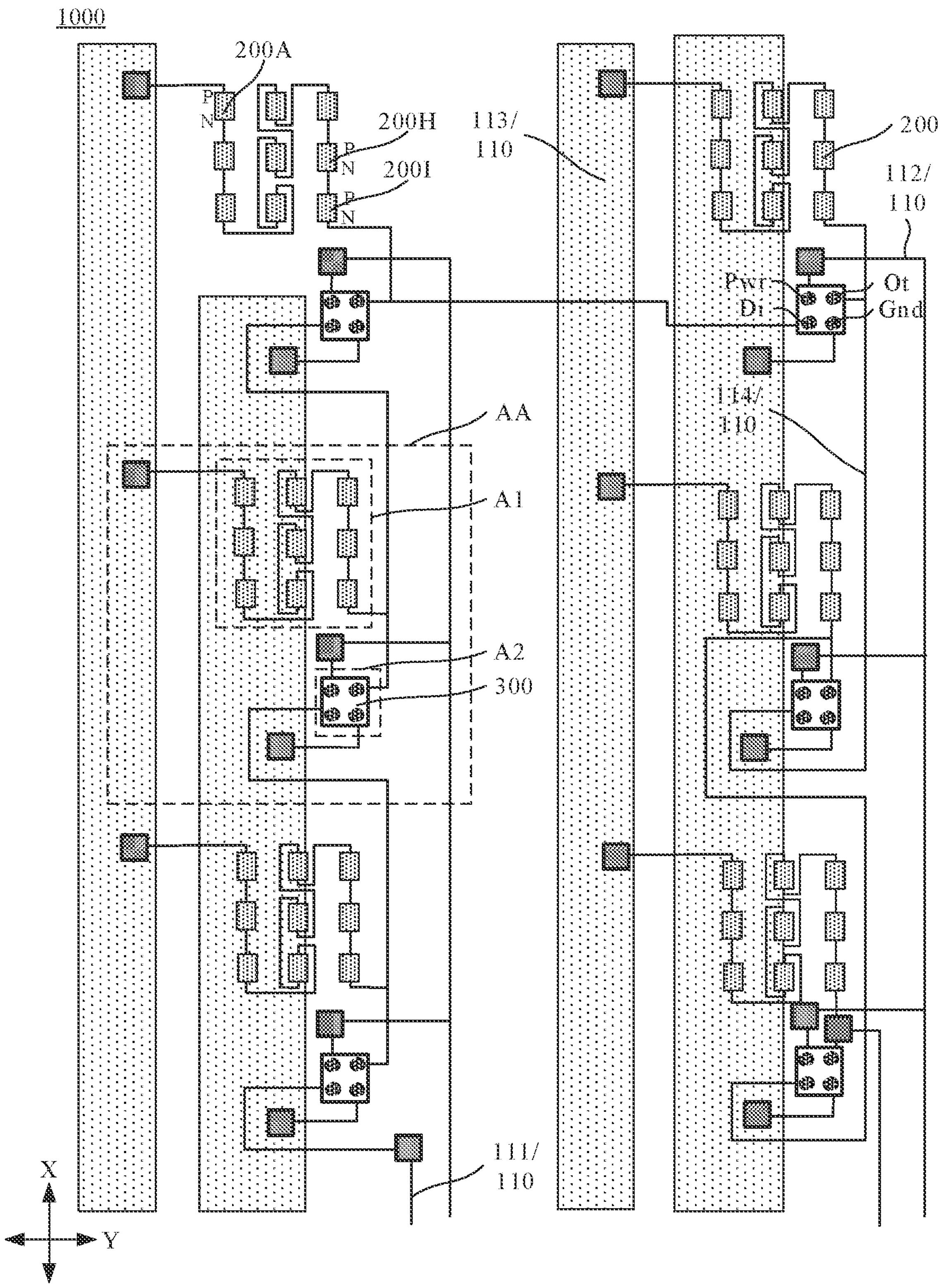
FIG. 1C is a structural diagram of another backboard, in accordance with some embodiments.

FIG. 1C is a structural diagram of a backboard 1000, in accordance with some other embodiments.

Referring to FIG. 1C, in some examples, a plurality of device regions AA in the backboard 1000 are arranged in a plurality of rows and a plurality of columns. In two device regions AA that are adjacent in a column direction X, an address pin Di of a driving chip 300 in a device region AA is electrically connected to an output pin Ot of a driving chip 300 in the other device region AA. Referring to FIG. 1C, a direction indicated by an arrow X is the column direction X.

In some examples, a device region AA is provided with a plurality of functional branches therein, each functional branch includes multiple functional elements 200 that are connected in series, and the plurality of functional branches are connected in parallel. In some other examples, a device region AA is provided with a single functional branch. That is, in this case, all functional elements 200 in the device region AA are connected in series. For example, the number of functional elements 200 in a functional branch may be 4, 6, 9 or more, which is not specifically limited here. All functional elements 200 that are connected in series in a device region AA or multiple functional elements 200 that are connected in series in a functional branch are electrically connected between a respective driving voltage line 113 and a respective output pin Ot.

In yet other examples, a device region AA may be provided with a plurality of functional branches that are connected in parallel therein, and each functional branch includes at least one functional element 200. In a case where a functional branch includes functional elements 200, the functional elements 200 belonging to the same functional branch are connected in series. The number of functional elements in each functional branch is not limited. Two ends of each functional branch are electrically connected to a driving voltage line 113 and an output pin Ot, respectively.

Figure 1D:
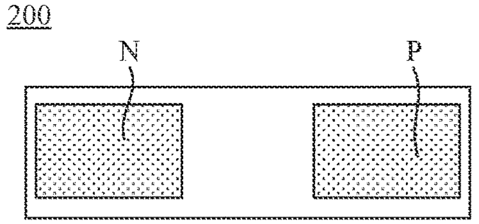
FIG. 1D is a structural diagram of a functional element, in accordance with some embodiments.

FIG. 1D is a bottom plan view of a structure of a functional element 200, in accordance with some embodiments.

Referring to FIG. 1D, in some examples, the functional element 200 has two pins, which are a first pin P and a second pin N.

With continued reference to FIG. 1C, in a functional branch, a first pin P of a first functional element 200A is electrically connected to a driving voltage line 113, a second pin N of a former functional element 200 is electrically connected to a first pin P of a latter functional element 200, and a second pin N of a last functional element 200 is electrically connected to an output pin Ot. The former functional element 200 and the latter functional element 200 are two adjacent functional elements 200, and a length of a conductive line 110 between the former functional element 200 and the driving voltage line 113 is greater than a length of a conductive line 110 between the latter functional element 200 and the driving voltage line 113.

For example, referring to FIG. 1C, there are 9 functional elements 200 included in the same device region AA, and the 9 functional elements 200 are sequentially a first functional element 200A, . . . , an eighth functional element 200H and a ninth functional element 200I.

It will be understood that, in the eighth functional element 200H and the ninth functional element 200I, the eighth functional element 200H is a former functional element 200, and the ninth functional element 200I is a latter functional element 200. A second pin N of the eighth functional element 200H is electrically connected to a first pin P of the ninth functional element 200I, and a second pin N of the ninth functional element 200I is electrically connected to an output pin Ot of a driving chip 300.

The wiring substrate 100 will be described below.

Figure 2A:
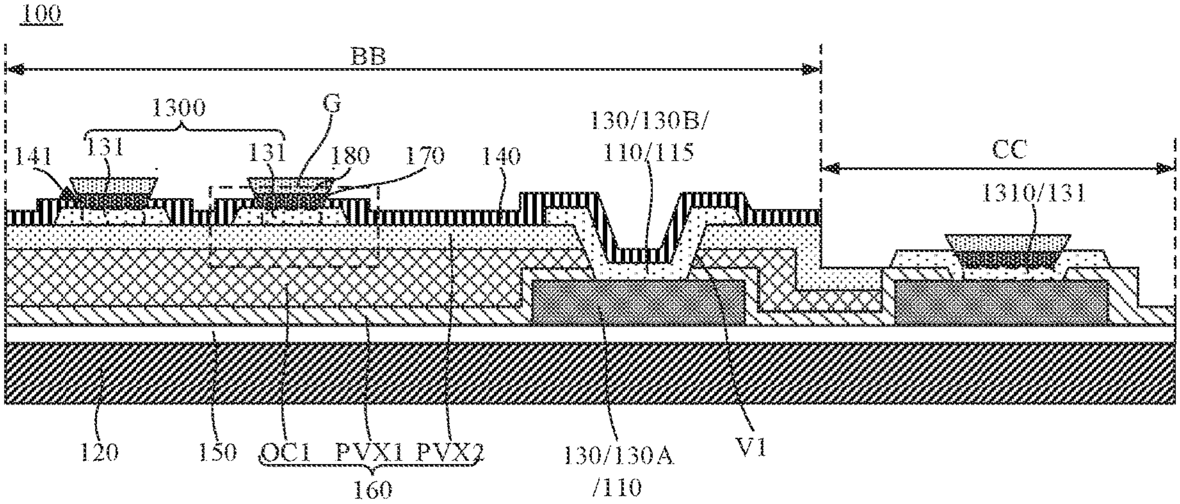
FIG. 2A is a sectional view of a wiring substrate, in accordance with some embodiments.

FIG. 2A is a sectional view of the wiring substrate 100, in accordance with some embodiments.

Referring to FIG. 2A, some embodiments of the present disclosure provide a wiring substrate 100. The wiring substrate 100 includes a substrate 120, conductive layer(s) 130 and a protective layer 140. The conductive layer(s) 130 are located on a side of the substrate 120, and the protective layer 140 is located on a side of the conductive layer(s) 130 away from the substrate 120. The protective layer 140 includes a plurality of openings 141, and a portion of the conductive layer 130 exposed by an opening 141 is a conductive pad 131.

For example, the substrate 120 is a flexible substrate, which may achieve bending of the wiring substrate 100 and the backboard 1000. Of course, the substrate 120 may be a rigid substrate. For example, a material of the substrate 120 may include any one of plastic, an FR-4 grade material, a resin, glass, quartz, polyimide and polymethyl methacrylate (PMMA).

For example, the protective layer 140 may be made of an insulating material such as silicon oxide, silicon nitride or silicon oxynitride. The protective layer 140 may protect the conductive layer(s) 130.

For example, a conductive layer 130 may include a plurality of material layers. For example, the conductive layer 130 includes a copper (Cu) layer and two molybdenum niobium (MoNb) layers, and the two MoNb layers are respectively disposed on two opposite surfaces of the Cu layer. It will be understood that a surface of the Cu layer faces the substrate 120, and the other surface faces away from the substrate 120. In addition, the conductive layer 130 may be made of only Cu.

The conductive layer 130 includes the plurality of conductive lines 110, and a portion of a conductive line 110 exposed by an opening 141 is a conductive pad 131. It will be noted that the opening 141 may be formed by etching the protective layer. In a case where a surface layer, in a region exposed by the opening 141, of the conductive layer 130 is a MoNb layer, there is a need to etch the MoNb layer to expose the Cu layer, so that a weldability of the subsequently formed conductive pad 131 is ensured.

Referring to FIG. 2A, in some embodiments, the wiring substrate includes two conductive layers 130. A first conductive layer 130A is located on the side of the substrate 120, and a part of the conductive lines 110 are located in the first conductive layer 130A. For convenience of description, the conductive lines 110 located in the first conductive layer 130A may be referred to as signal lines. For example, the signal lines in the first conductive layer 130A include the source address line 111, the source voltage line 112, the driving voltage line 113 and the common voltage line 114.

A second conductive layer 130B is located on a side of the first conductive layer 130A away from the substrate 120, and the other part of the conductive lines 110 are located in the second conductive layer 130B. For convenience of description, the other part of the conductive lines 110 located in the second conductive layer 130B are referred to as transfer lines 115.

A conductive line 110 in the first conductive layer 130A is connected to at least one conductive line 110 located in the second conductive layer 130B through a via hole V1. For example, each of the source address line 111, the source voltage line 112, the driving voltage line 113 and the common voltage line 114 is connected to at least one transfer line 115 through a via hole.

A portion, exposed by an opening 141, of a conductive line 110 located in the second conductive layer 130B is a conductive pad 131. That is, a portion, exposed by the opening 141, of a transfer line 115 is the conductive pad 131.

In addition to the conductive layers 130 and the protective layer 140, the wiring substrate 100 further includes other film layers. The other film layers in the wiring substrate 100 will be described below based on the embodiments in which the wiring substrate 100 includes two conductive layers 130.

Referring to FIG. 2A, in some examples, a buffer layer 150 is provided on the side of the substrate 120, and the buffer layer 150 is located between the substrate 120 and the first conductive layer 130A.

An insulating layer 160 is formed on the side of the first conductive layer 130A away from the substrate 120, and the insulating layer 160 is located between the second conductive layer 130B and the first conductive layer 130A. For example, the insulating layer 160 includes a first passivation layer PVX1, a first resin layer OC1 and a second passivation layer PVX2 that are sequentially arranged on the first conductive layer 130A.

The insulating layer 160 is provided with via holes formed therein, and the second conductive layer 130B may be connected to the first conductive layer 130A through the via holes in the insulating layer 160.

For example, the first passivation layer PVX1 may be made of an inorganic insulating material such as silicon nitride (SiN).

For example, a material of the first passivation layer PVX1, a material of the second passivation layer PVX2 and a material of the protective layer 140 are the same. For example, the first resin layer OC1 may be made of a resin material.

In the above embodiments, the embodiments in which the wiring substrate 100 includes two conductive layers 130 are described. In some other embodiments, the wiring substrate 100 may include one conductive layer 130.

Figure 2B:
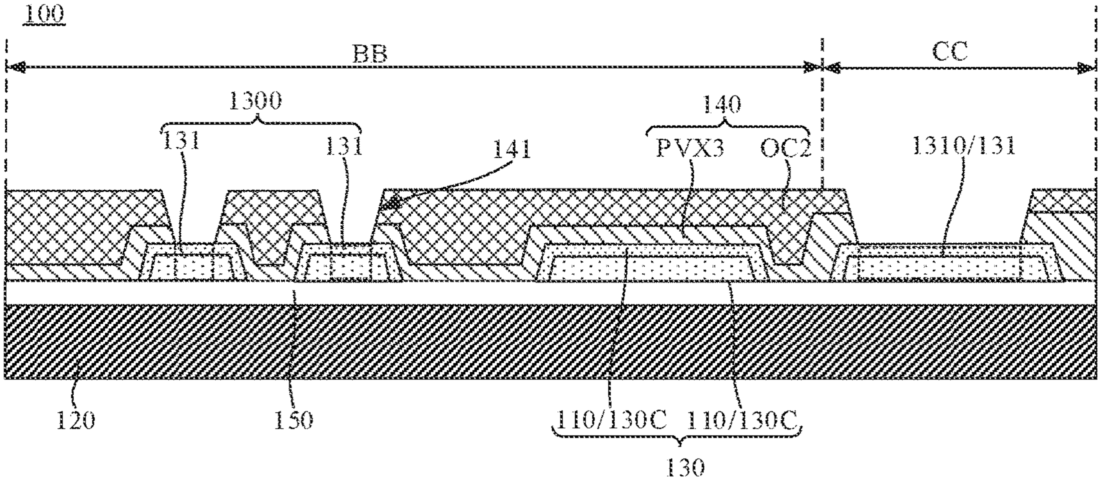
FIG. 2B is a sectional view of another wiring substrate, in accordance with some embodiments.

FIG. 2B is a sectional view of a wiring substrate 100, in accordance with some other embodiments.

Referring to FIG. 2B, the wiring substrate 100 includes a buffer layer 150, a conductive layer 130 and a protective layer 140 that are sequentially stacked on a substrate 120. The protective layer 140 includes a third passivation layer PVX3 and a second resin layer OC2.

Referring to FIG. 2B, in some examples, the conductive layer 130 may be of a double-layer structure. In this case, the conductive layer 130 may include two conductive sub-layers 130C. The two conductive sub-layers 130C may be formed by two processes, so as to avoid an excessive thickness of a conductive layer 130 formed by a single process.

Figure 2C:
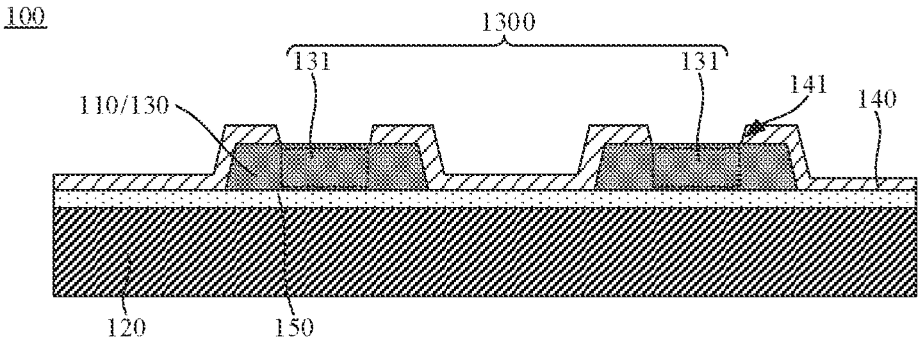
FIG. 2C is a sectional view of yet another wiring substrate, in accordance with some embodiments.

FIG. 2C is a sectional view of a wiring substrate 100, in accordance with yet other embodiments.

Referring to FIG. 2C, in some other examples, in a case where the wiring substrate 100 includes one conductive layer 130, the conductive layer 130 may be of a single-layer structure.

In addition, it will be noted that, with continued reference to FIG. 2A, in a case where the wiring substrate 100 includes two conductive layers 130, the conductive layers 130 may be each of a single-layer structure. Alternatively, the first conductive layer 130A includes two conductive sub-layers, and/or the second conductive layer 130B includes two conductive sub-layers.

Referring to FIGS. 2A and 2B, the conductive layer 130 includes a plurality of pad groups 1300, and a pad group 1300 includes a plurality of conductive pads 131. The plurality of conductive pads 131 are arranged at intervals.

A pad group 1300 may be electrically connected to an electronic element. The plurality of pad groups 1300 may be classified into a plurality of types, a pad group 1300 in each type may be electrically connected to an electronic element in a respective type, and a type of an electronic element to which a pad group 1300 in a different type is electrically connected is different. The number of pad groups 1300 in each type may be one or more.

Figure 2D:
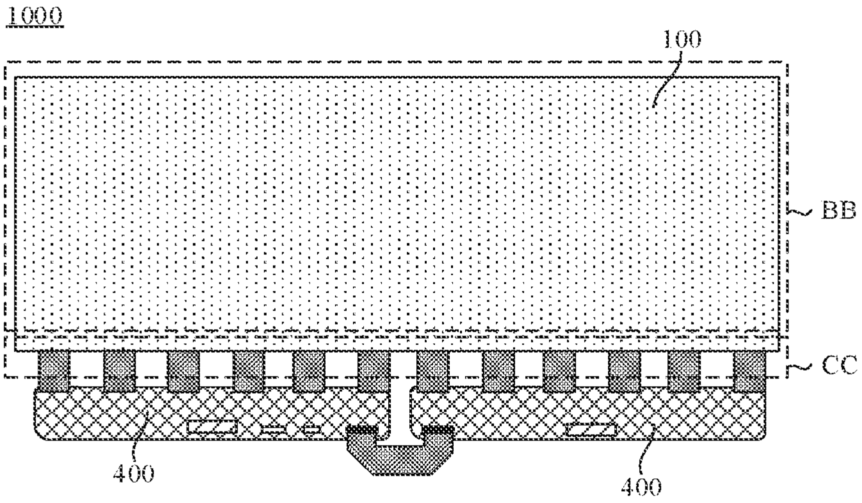
FIG. 2D is a structural diagram of yet another backboard, in accordance with some embodiments.

For example, the electronic elements may include the functional element 200 and the driving chip 300. The functional element may be an inorganic light-emitting diode, and a light-emitting area of the inorganic light-emitting diode is not greater than 300000 $\mu m^2$. For example, the light-emitting area of the inorganic light-emitting diode may be not greater than 40000 $\mu m^2$. An area of an orthographic projection of the driving chip 300 on the substrate 120 is not greater than 300000 $\mu m^2$. FIG. 2D is a structural diagram of the backboard 1000, in accordance with some embodiments.

Referring to FIG. 2D, the backboard 1000 may further include other types of elements such as a circuit board 400. The circuit board 400 is located on a side of the wiring substrate 100.

The wiring substrate 100 includes a functional region BB and a bonding region CC. It will be noted that, in FIG. 2D, dashed boxes indicated by BB and CC are only for respectively illustrating positions of the functional region BB and the bonding region CC, and are not respective limitations on the functional region BB and the bonding region CC.

The plurality of device regions AA (as shown in FIG. 1C) are located in the functional region BB, and thus the plurality of pad groups 1300 (as shown in FIGS. 2A and 2B) are located in the functional region BB.

As shown in FIGS. 2A and 2B, the plurality of conductive pads 131 include a circuit board pad 1310, the circuit board pad 1310 is located in the bonding region CC, and the circuit board pad 1310 may be bonded to a pin of the circuit board 400.

For example, the electronic elements, such as the functional element 200, the driving chip 300 and the circuit board 400, may be each fixedly connected to a respective conductive pad 131 by using a surface mounted technology (SMT). For example, a pin of the functional element 200 and a pin of the driving chip 300 are each connected to a respective conductive pad 131 by soldering.

For example, the pin of the functional element 200 and the pin of the driving chip 300 are each soldered by using tin-based solder. After a reflow soldering process, an intermetallic compound (IMC) layer, such as a $Cu_6Sn_5$ layer, is prone to be formed between the tin-based solder and the Cu layer of the pad. The IMC layer indicates that a good connection is formed between the pad and the device. However, the IMC is a brittle substance, and an excessive thickness thereof will seriously reduce a reliability at a soldering joint. In order to prevent the IMC layer with the excessive thickness from being formed at the soldering joint, a barrier layer is provided in the pad structure by introducing an electroless nickel/immersion gold process, so as to prevent the copper-tin (Cu—Sn) compound from being formed rapidly.

Referring to FIG. 2A, in some embodiments, the barrier layer in the wiring substrate 100 further includes an oxidation prevention layer 170 and a conductive functional layer 180, the oxidation prevention layer 170 covers a side of the conductive pad 131 away from the substrate 120, and the conductive functional layer 180 covers a side of the oxidation prevention layer 170 away from the substrate 120.

The oxidation prevention layer 170 is provided on the side of the conductive pads 131 away from the substrate 120, so that it is possible to protect the conductive pads 131 and reduce an oxidation degree of the conductive pads 131. The conductive functional layer 180 is provided on the side of the oxidation prevention layer 170 away from the conductive pads 131, so that the oxidation prevention layer 170 may be protected. That is, it is possible to further protect the conductive pads 131 and reduce the oxidation degree of the conductive pads 131 and an oxidation degree of the oxidation prevention layer 170. Thus, a difficulty in soldering the wiring substrate 100 and each of the functional element 200 and the driving chip 300 is reduced, so that a reliability of a connection between the wiring substrate 100 and each of the functional element 200 and the driving chip 300 is further improved.

For example, a material of the oxidation prevention layer 170 includes nickel (Ni). Ni is a conductive material. Ni may chemically react with a material (e.g., Sn) in the solder, which improves wettability of the solder during soldering, so that soldering firmness between the functional element 200 and the conductive pad 131, and soldering firmness between the driving chip 300 and the conductive pad 131 are each improved. As a result, the reliability of the connection between the wiring substrate 100 and each of the functional element 200 and the driving chip 300 is further improved.

For example, the conductive functional layer 180 includes a conductive material such as gold (Au).

A process of forming the oxidation prevention layer 170 and the conductive functional layer 180 that are in some embodiments of the present disclosure will be described below based on an example where the material of the oxidation prevention layer 170 includes Ni, and the material of the conductive functional layer 180 includes Au.

In some examples, the oxidation prevention layer 170 and the conductive functional layer 180 may be formed by using the electroless nickel/immersion gold process.

In the electroless nickel/immersion gold process, acid washing is firstly performed on the wiring substrate 100, and then the wiring substrate 100 is placed in an activation solution containing palladium ions $Pd^{2+}$. In this case, Cu in the conductive pad 131 reacts with $Pd^{2+}$ in the activation solution to generate copper ions $Cu^{2+}$ and palladium (Pd), and Pd adheres to the surface of the Cu layer away from the substrate 120 to form a Pd layer. Then, the wiring substrate 100 is placed in a solution of which main constituents are nickel sulfate, sodium hypophosphite (a reducing agent for reducing nickel ions to metallic nickel) and a complexing agent, and a phosphorus-nickel alloy layer (i.e., the oxidation prevention layer 170) is formed on a surface of the pad. Since the phosphorus-nickel alloy layer is still prone to be oxidized, and soldering between the solder and the oxidized phosphorus-nickel alloy layer is difficult and unreliable, there is a need to immerse the wiring substrate 100 in a solution containing gold ions to form a gold leaching layer (i.e., the conductive functional layer 180) on a surface of the phosphorus-nickel alloy layer, and gold particles in the gold leaching layer may fill gaps in a chemical nickel-gold layer, which reduces an oxidation probability of the phosphorus-nickel alloy layer, so that the oxidation degree of the conductive pad 131 is reduced. After that, the electronic element is soldered, by the reflow soldering process with the solder, to the conductive pad 131 of which the surface has the chemical nickel-gold layer (including the oxidation prevention layer 170 and the conductive functional layer 180).

Figure 3:
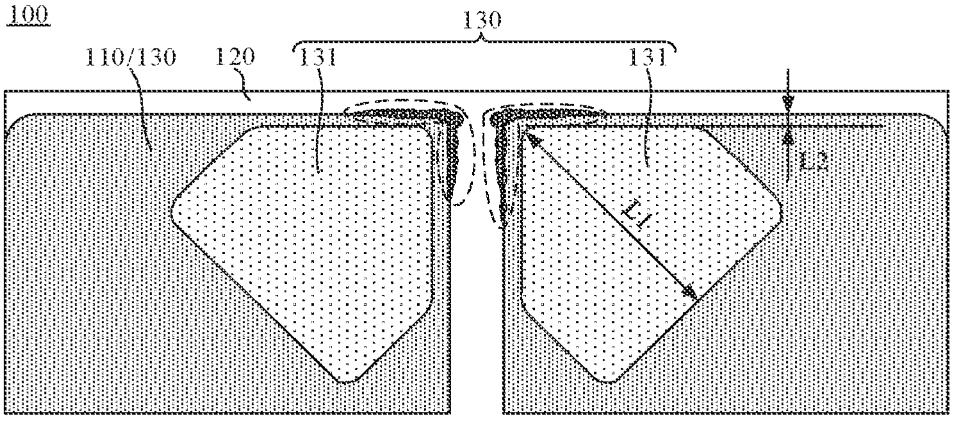
FIG. 3 is a structural diagram of a wiring substrate, in accordance with some implementations.

FIG. 3 is a structural diagram of a wiring substrate 100, in accordance with some implementations.

Referring to FIG. 3, after the electroless nickel/immersion gold process, the oxidation prevention layer 170 (as shown in FIG. 2A) and the conductive functional layer 180 (as shown in FIG. 2A) are formed not only on the conductive pad 131, but also formed on an edge of a conductive line 110 near the conductive pad 131. In the implementations, for convenience of description, a phenomenon that the oxidation prevention layer 170 and the conductive functional layer 180 are formed on the edge of the conductive line 110 is referred to as an abnormal growth phenomenon, and a region where at least one of the oxidation prevention layer 170 and the conductive functional layer 180 is formed on the edge of the conductive line 110 is referred to as an abnormal region. As shown in FIG. 3, abnormal regions are enclosed by dashed boxes.

It is found by the inventors of the present disclosure that the causes of the abnormal growth phenomenon are as described below.

Figure 4A:
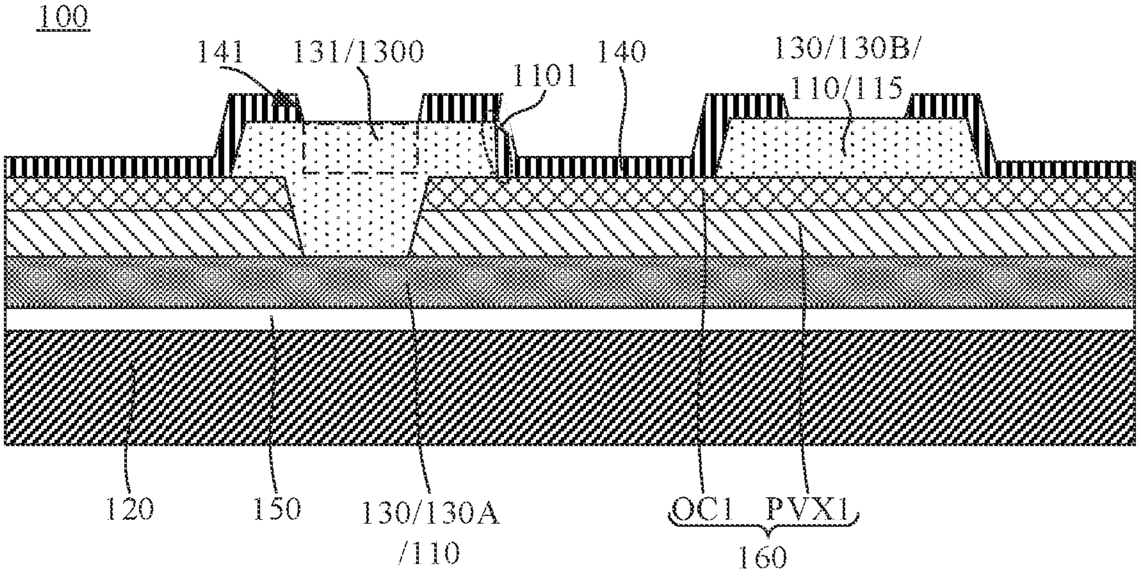
FIG. 4A is a sectional view of a wiring substrate, in accordance with some implementations.
Figure 4B:
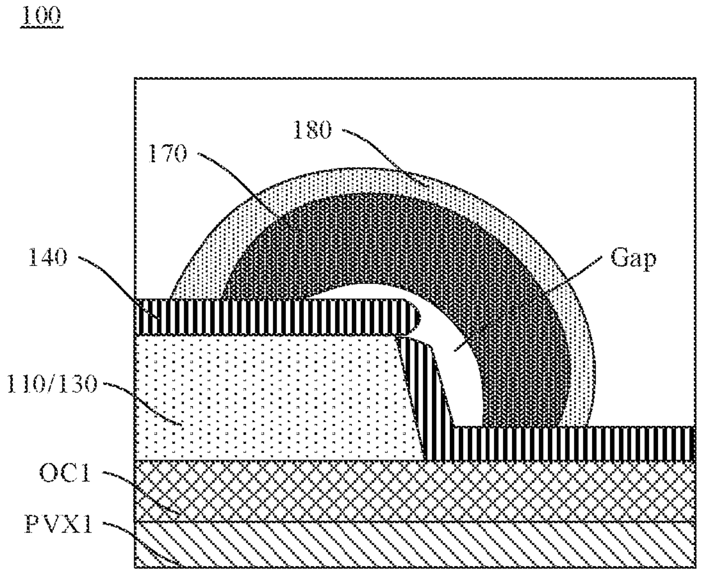
FIG. 4B is another sectional view of a wiring substrate, in accordance with some implementations.

FIG. 4A is a sectional view of the wiring substrate 100, in accordance with some implementations. FIG. 4B is another sectional view of the wiring substrate 100, in accordance with some implementations.

Referring to FIG. 4A, the edge of the conductive line 110 has a level difference structure 1101, and the level difference structure 1101 needs to be covered by the protective layer 140. The level difference structure 1101 generally causes the protective layer 140 covered thereon to have a tip structure and then crack, so that the level difference structure 1101 lacks of a protection from the protective layer 140. As a result, a partial region of the level difference structure 1101 is exposed. Thus, in the electroless nickel/immersion gold process, the exposed region of the level difference structure 1101 is immersed in the activation solution, which results in abnormal growth of the oxidation prevention layer 170 and/or the conductive functional layer 180 at the level difference structure 1101.

Referring to FIG. 4B, the oxidation prevention layer 170 and the conductive functional layer 180 that are at the level difference structure 1101 (referring to FIG. 4A) each expand into a spherical shape at the level difference structure 1101. In some cases, the oxidation prevention layer 170 is not in complete contact with the level difference structure 1101. That is, there is a gap between the two. Thus, the existence of the gap provides a path for moisture and oxygen to erode the conductive line 110.

With continued reference to FIG. 3, portions of the abnormally grown oxidation prevention layer 170 and/or the abnormally grown conductive functional layer 180 are connected, along the edge of the conductive line 110, to be in a shape of a strip.

Especially the portions, that grow abnormally along the edge of the conductive line 110 and are connected to be in the shape of the strip, of the oxidation prevention layer 170 and/or the conductive functional layer 180 are prone to detach, and when the portions detach, a tensile force is generated to other positions of the conductive line 110. As a result, a portion of the conductive line 110 near the abnormal region detaches due to the tensile force, which causes the conductive line 110 to crack, so that the functional elements 200 connected to the conductive line 110 fails. In addition, if the detached abnormal grown portion laps the conductive pad 131, short circuit may occur in a region where the conductive pad 131 is located, so that the functional element 200 electrically connected to the conductive pad 131 cannot operate normally.

With continued reference to FIG. 3, in an implementation, a maximum dimension L1 of the conductive pad 131 in a direction parallel to the substrate 120 is much greater than a minimum distance L2 between an edge of the conductive pad 131 and an edge of the conductive layers 130.

Firstly, it will be noted that an orthographic projection of the conductive pad 131 on the substrate 120 may be in a shape of a polygon such as a rectangle, a square or a pentagon. In some examples, the orthographic projection of the conductive pad 131 on the substrate 120 may be in a shape of a circle. In a case where the conductive pad 131 is in the shape of the circle, the maximum dimension of the conductive pad 131 in the direction parallel to the substrate 120 is a diameter of the circle. In a case where the conductive pad 131 is a convex polygon, referring to FIG. 4B, the maximum dimension of the conductive pad 131 in the direction parallel to the substrate 120 is a length of a diagonal of the conductive pad 131.

In addition, it will be noted that, referring to FIG. 3, the conductive layer 130 include the conductive line 110, and the conductive pad 131 is located in an end region of the conductive line 110. Except that a surface, in which the conductive pad 131 is located, of the conductive line 110 is exposed, surfaces, that are in the remaining regions, of the conductive line 110 are all covered by other film layers (e.g., the protective layer). The edge of the conductive layer 130 refers to the edge of the conductive line 110 including the conductive pad 131. The minimum distance L2 between the edge of the conductive pad 131 and the edge of the conductive layer 130 refers to a minimum distance between the edge of the conductive pad 131 and the edge of the conductive line 110 in which the conductive pad 131 is located. The conductive line 110 has a plurality of edges, and one or more edges each have a minimum distance to the edge of the conductive pad 131.

Figure 4C:
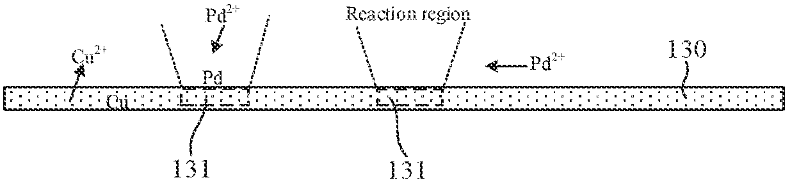
FIG. 4C is a diagram showing a principle of an activation reaction, in accordance with some implementations.

FIG. 4C is a diagram showing a principle of an activation reaction, in accordance with some implementations. It will be noted that, in FIG. 4C, arrows each indicate a moving direction of respective ions.

Referring to FIG. 4C, in the activation reaction, $Pd^{2+}$ is an important catalyst for depositing Ni, $Pd^{2+}$ in a reaction region in the activation solution is rapidly consumed and deposited, while $Pd^{2+}$ in remaining regions diffuses and gathers in the reaction region to supplement $Pd^{2+}$ in the reaction region. It will be noted that the reaction region is a region near the conductive pad 131. The larger an area of the conductive pad 131 and the larger a value of the maximum dimension L1, the faster the consumption speed of $Pd^{2+}$ in the reaction region, the faster the diffusion speed of $Pd^{2+}$, and the easier it is to deposit a Pd layer on the exposed level difference structure 1101 (as shown in FIG. 4A), and thus the easier it is to catalyze growths of the oxidation prevention layer 170 and the conductive functional layer 180 in a subsequence process.

In the above implementations, the maximum dimension L1 is much greater than the minimum distance L2, and the area of the conductive pad 131 is too large. Therefore, $Pd^{2+}$ in the reaction region in the activation solution is consumed too fast, and the diffusion speed of $Pd^{2+}$ in the solution is too fast. Thus, the Pd layer is rapidly deposited on the exposed level difference structure 1101, which catalyzes the growths of the oxidation prevention layer 170 and the conductive functional layer 180 in the subsequence process, so that the abnormal growth phenomenon occurs.

Figure 5:
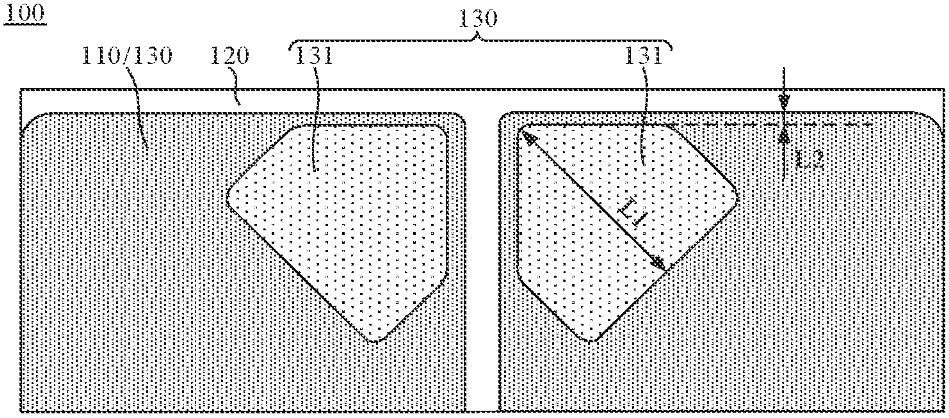
FIG. 5 is a structural diagram of a wiring substrate, in accordance with some embodiments.

In light of this, referring to FIG. 5, FIG. 5 is a structural diagram of the wiring substrate 100, in accordance with some embodiments. In the wiring substrate 100 provided in some embodiments of the present disclosure, a maximum dimension L1 of the conductive pad 131 in a direction parallel to the substrate 120 is greater than or equal to 1.5 times a minimum distance L2 between an edge of the conductive pad 131 and an edge of the conductive layer 130, and less than or equal to 30 times the minimum distance L2 between the edge of the conductive pad 131 and the edge of the conductive layer 130. That is, $1.5 \cdot L2 \leq L1 \leq 30 \cdot L2$.

For example, $2 \cdot L2 \leq L1 \leq 28 \cdot L2$.

For example, $1.5 \cdot L2 \leq L1 \leq 7.5 \cdot L2$.

For example, $8 \cdot L2 \leq L1 \leq 28 \cdot L2$.

For example, $2.5 \cdot L2 \leq L1 \leq 11 \cdot L2$.

For example, $10 \cdot L2 \leq L1 \leq 27 \cdot L2$. Since $L1 \leq 30 \cdot L2$, the maximum dimension L1 of the conductive pad 131 in the direction parallel to the substrate 120 is relatively small. Therefore, a consumption speed of $Pd^{2+}$ in a reaction region in an activation solution may be relatively slow, and an diffusion speed of $Pd^{2+}$ in the solution is relatively slow, which may reduce a speed of depositing a Pd layer on an exposed level difference structure 1101 and a speed of catalyzing growths of the oxidation prevention layer 170 and the conductive functional layer 180 in the subsequence process, so that an abnormal growth phenomenon is ameliorated or even avoided.

In addition, $L1 \geq 1.5 \cdot L2$. Therefore, it is possible to prevent the maximum dimension L1 of the conductive pad 131 in the direction parallel to the substrate 120 from being too small (e.g., less than $1.5 \cdot L2$), so that a reliability of a connection between the conductive pad 131 and the pin of the electronic element is ensured.

Figure 6:
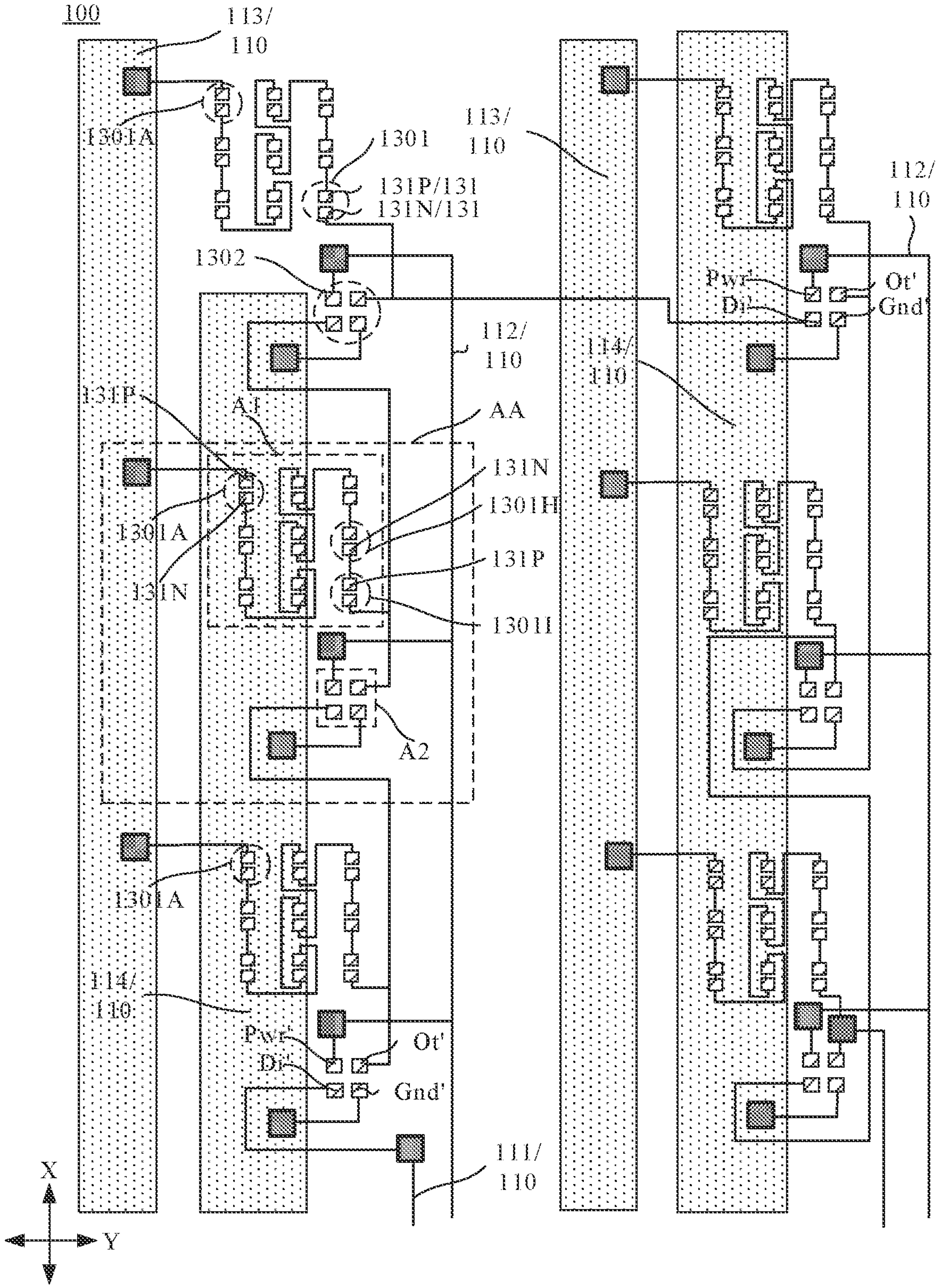
FIG. 6 is a structural diagram of another wiring substrate, in accordance with some embodiments.

FIG. 6 is a structural diagram of the wiring substrate 100, in accordance with some embodiments.

Referring to FIG. 6, in some embodiments, the wiring substrate 100 includes a plurality of device regions AA. The plurality of pad groups 1300 include a plurality of first pad groups 1301 and a single second pad group 1302 that are located in any device region AA.

It will be noted that the backboard 1000 includes the wiring substrate 100, and the device region AA in the wiring substrate 100 and the device region AA in the backboard 1000 are a same region.

Figure 7:
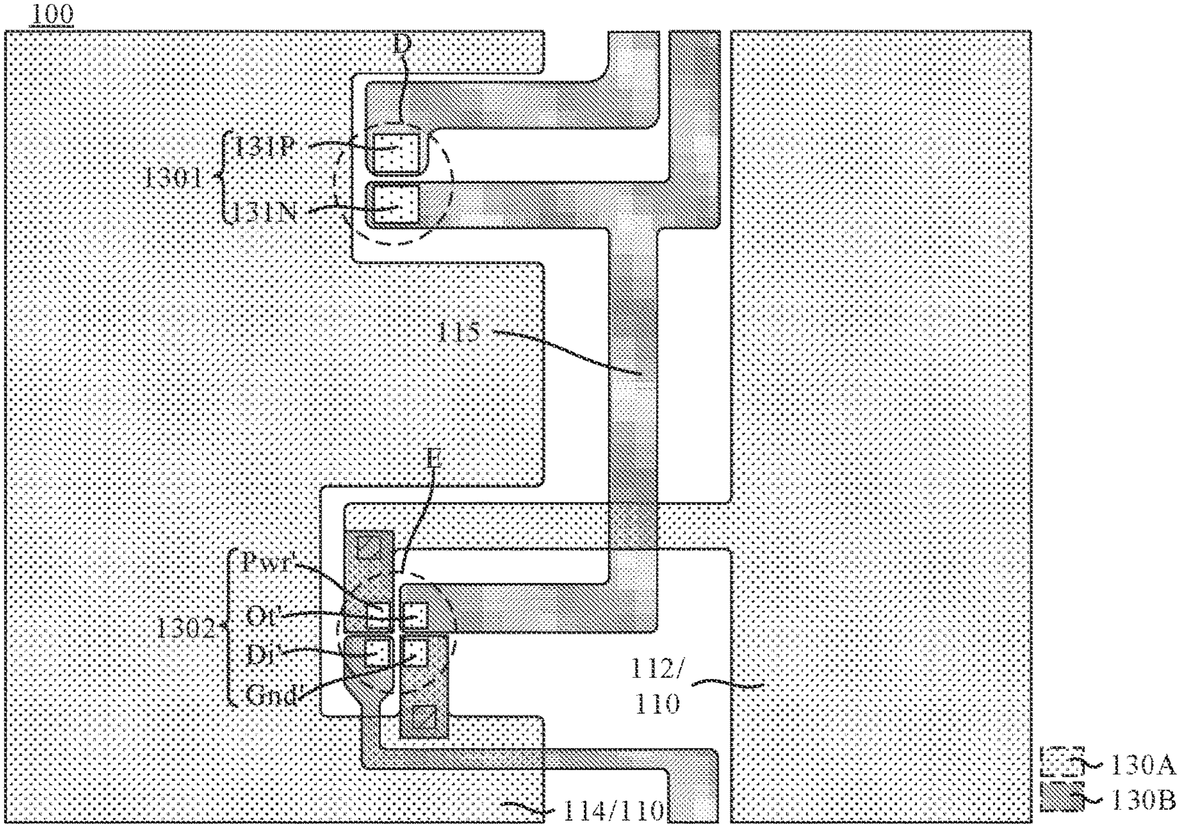
FIG. 7 is a structural diagram of yet another wiring substrate, in accordance with some embodiments.

FIG. 7 is a structural diagram of the wiring substrate 100, in accordance with some embodiments. FIG. 7 shows a single first pad group 1301 and a single second pad group 1302.

Referring to FIG. 7, the first pad group 1301 includes a first electrode pad 131P and a second electrode pad 131N that are spaced apart from each other. Here, it will be understood that the number of conductive pads 131 in the first pad group 1301 is not limited to two. That is, in some examples, the first pad group 1301 may include only the first electrode pad 131P and the second electrode pad 131N. In some other examples, the first pad group 1301 may further include other conductive pad(s) 131.

In some examples, orthographic projections, on the substrate 120, of the first electrode pad 131P and the second electrode pad 131N may be each in a shape of a circle, or a polygon such as a square, a rectangle or a pentagon.

The first electrode pad 131P may be connected to the first pin P of the functional element 200, and the second electrode pad 131N may be connected to the second pin N of the functional element 200. The functional element 200, and the first pin P and the second pin N of the functional element 200 are all not shown in FIG. 7, and reference may be made to FIG. 1D.

An area of the first electrode pad 131P is greater than that of the first pin P. and an area of the second electrode pad 131N is greater than that of the second pin N, so that the reliability of the connection between the functional element 200 and the wiring substrate 100 may be ensured.

Referring to FIG. 7, the second pad group 1302 includes at least a power supply pad Pwr', a grounding pad Gnd', an address pad Di' and an output pad Ot' that are arranged at intervals. The second pad group 1302 is connected to the driving chip 300. The power supply pad Pwr' is connected to the power supply pin Pwr of the driving chip 300, the grounding pad Gnd' is connected to the grounding pin Gnd of the driving chip 300, the address pad Di' is connected to the address pin Di of the driving chip 300, and the output pad Ot' is connected to the output pin Ot of the driving chip 300.

In some examples, orthographic projections, on the substrate 120, of the power supply pad Pwr', the grounding pad Gnd', the address pad Di' and the output pad Ot' may be each in a shape of a circle, or a polygon such as a square, a rectangle or a pentagon.

In some examples, the address pad Di' and the output pad Ot' are respectively opposite to two adjacent edges of the power supply pad Pwr'. In addition, the address pad Di' and the output pad Ot' are respectively opposite to two adjacent edges of the grounding pad Gnd'.

With continued reference to FIG. 6, the wiring substrate 100 further includes the source address lines 111, the source voltage lines 112, the driving voltage lines 113 and the common voltage lines 114.

In the same device region AA, the power supply pad Pwr' is electrically connected to a source voltage line 112, and the address pad Di' is electrically connected to an output pad Ot' in another device region AA. The power supply pad Pwr' is electrically connected to the source voltage line 112, the grounding pad Gnd' is electrically connected to a common voltage line 114, the address pad Di' is electrically connected to a source address line 111, and the output pad Ot' is electrically connected to a driving voltage line 113.

In the case where the wiring substrate 100 includes the two conductive layers 130, the conductive pad 131 is located in the second conductive layer 130B. In this case, the power supply pad Pwr' is electrically connected to the source voltage line 112 via a transfer line 115 (as shown in FIG. 7), the grounding pad Gnd' is electrically connected to the common voltage line 114 via another transfer line 115, the address pad Di' is electrically connected to the source address line 111 via yet another transfer line 115, and the output pad Ot' is electrically connected to the driving voltage line 113 via yet another transfer line 115.

Referring to FIG. 6, in the same device region AA, of the first pad groups 1301, a first electrode pad 131P of a first first pad group 1301A is electrically connected to the driving voltage line 113, and the first electrode pad 131P of the first first pad group 1301A is connected to the first pin P of the first functional element 200A (as shown in FIG. 1C), so that the first pin P of the first functional element 200A is electrically connected to the driving voltage line 113.

In some examples, the plurality of device regions AA are arranged in a plurality of rows and a plurality of columns. First electrode pads 131P of first first pad groups 1301A in a column of device regions AA are connected to a same driving voltage line 113, and thus the first electrode pads 131P of the first first pad groups 1301A are connected in parallel.

Referring to FIG. 6, in the same device region AA, a second electrode pad 131N of a former first pad group 1301 is electrically connected to a first electrode pad 131P of a latter first pad group 1301, and a second electrode pad 131N of a last first pad group 1301 is electrically connected to the output pad Ot'. It will be noted that the former first pad group 1301 and the latter first pad group 1301 refer to two adjacent first pad groups 1301.

The same device region AA may be provided with one or more functional branches therein, and a functional branch has a single first functional element 200A (as shown in FIG. 1C). It will be understood that the same device region AA may be provided with one or more first first pad groups 1301A therein.

In the case where the wiring substrate 100 includes the two conductive layers 130, the second electrode pad 131N of the former first pad group 1301 and the first electrode pad 131P of the latter first pad group 1301 are respectively disposed on two ends of a transfer line 115.

For example, referring to FIG. 6, there are 9 first pad groups 1301 included in the same device region AA, and the 9 first pad groups 1301 are sequentially the first first pad group 1301A, . . . , an eighth first pad group 1301H and a ninth first pad group 1301I. The ninth first pad group 1301I is the last first pad group 1301.

It will be understood that, in the eighth first pad group 1301H and the ninth first pad group 1301I, the eighth first pad group 1301H is the former first pad group 1301, and the ninth first pad group 1301I is the latter first pad group 1301. A second electrode pad 131N of the eighth first pad group 1301H is electrically connected to a first electrode pad 131P of the ninth first pad group 1301I.

The first electrode pad 131P and the second electrode pad 131N of the first pad group 1301 are arranged adjacent to each other, the first electrode pad 131P and the second electrode pad 131N are insulated from each other, and the two need to be electrically connected via the functional element 200.

In some embodiments, a maximum dimension L1, in the direction parallel to the substrate 120, of at least a pad of at least the first electrode pad 131P of the first first pad group 1301A, the power supply pad Pwr' and the grounding pad Gnd' is less than or equal to 30 times a minimum distance L2 between an edge of the pad and an edge of a conductive layer 130. It will be understood that “the pad” as described here refers to any one of the at least the first electrode pad 131P of the first first pad group 1301A, the power supply pad Pwr' and the grounding pad Gnd'.

In the activation reaction, the activation solution may be a cathode, and the conductive layer 130 may be an anode. Cu in the conductive layer 130 loses electrons to generate $Cu^{2+}$, and the electrons lost by Cu may flow in the conductive lines 110. In this case, an electrochemical parallel reaction happens among the first electrode pads 131P of the first first pad groups 1301A connected to the same driving voltage line 113. That is, the first electrode pads 131P of the first first pad groups 1301A are connected in parallel. Therefore, electrons lost by the first electrode pads 131P of the first first pad groups 1301A flow in the driving voltage line 113. It will be noted that, in the case where the wiring substrate 100 includes the two conductive layers 130, the electrons lost by the first electrode pads 131P of the first first pad groups 1301A also flow in transfer lines 115 to which the driving voltage line 113 is connected.

It can be seen according to a principle of a parallel circuit that, a current of a main circuit of the parallel circuit is equal to a sum of currents of all branch circuits. Therefore, the greater the number of conductive pads 131 to which a conductive line 110 is electrically connected, the larger a current in the conductive line 110. The number of conductive pads 131 to which the driving voltage line 113 is electrically connected is relatively large and greater than the number of conductive pads 131 to which some other conductive lines 110 are each electrically connected, which causes a current in the driving voltage line 113 to be relatively large, so that a current in the first electrode pad 131P of the first first pad group 1301A to which the driving voltage line 113 is electrically connected is relatively large. The larger the current, the faster a speed of a replacement reaction (that is, the faster the speed of forming the Pd layer), and thus the easier it is to form the oxidation prevention layer 170 and the conductive functional layer 180 in the subsequence process. Therefore, the abnormal growth phenomenon is more prone to occur in a region (i.e., an exposed region of a respective level difference structure 1101), lacking of the protection from the protective layer, around the first electrode pad 131P of the first first pad group 1301A.

Similarly, power supply pads Pwr' of second pad groups 1302 are electrically connected to the source voltage line 112, so that the power supply pads Pwr' are connected in parallel. As a result, a current in the source voltage line 112 is relatively large, and a speed of a replacement reaction of the power supply pads Pwr' to which the source voltage line 112 is electrically connected is relatively fast (that is, the speed of forming the Pd layer is relatively fast), and thus the easier it is to form the oxidation prevention layer 170 and the conductive functional layer 180 in the subsequence process. Therefore, the abnormal growth phenomenon is more prone to occur in a region (i.e., an exposed region of a respective level difference structure 1101), lacking of the protection from the protective layer, around the power supply pad Pwr'.

Similarly, grounding pads Gnd' of the second pad groups 1302 are electrically connected to the common voltage line 114, so that the grounding pads Gnd' are connected in parallel. As a result, a current in the common voltage line 114 is relatively large, and a speed of a replacement reaction of the grounding pads Gnd' to which the common voltage line 114 is electrically connected is relatively fast (that is, the speed of forming the Pd layer is relatively fast), and thus the easier it is to form the oxidation prevention layer 170 and the conductive functional layer 180 in the subsequence process. Therefore, the abnormal growth phenomenon is more prone to occur in a region (i.e., an exposed region of a respective level difference structure 1101), lacking of the protection from the protective layer, around the grounding pad Gnd'.

Therefore, in the embodiments of the present disclosure, the maximum dimension L1, in the direction parallel to the substrate 120, of the at least one pad of the at least the first electrode pad 131P of the first first pad group 1301A, the power supply pad Pwr' and the grounding pad Gnd' is less than or equal to 30 times the minimum distance L2 between the edge of the pad and the edge of the conductive layer 130. In this way, it is possible to ameliorate the abnormal growth phenomenon occurring in the region, lacking of the protection from the protective layer, around the at least a pad of the first electrode pad 131P of the first first pad group 1301A, the power supply pad Pwr' and the grounding pad Gnd'.

In some examples, it is possible that only the maximum dimension L1, in the direction parallel to the substrate 120, of each of the first electrode pad 131P of the first first pad group 1301A, the power supply pad Pwr' and the grounding pad Gnd' is less than or equal to 30 times the minimum distance L2 between the edge of the pad and the edge of the conductive layer 130.

In some other examples, it is possible that the maximum dimension L1, in the direction parallel to the substrate 120, of each of some of the first electrode pad 131P of the first first pad group 1301A, the power supply pad Pwr' and the grounding pad Gnd' is less than or equal to 30 times the minimum distance L2 between the edge of the pad and the edge of the conductive layer 130.

In yet other examples, it is possible that the maximum dimension L1, in the direction parallel to the substrate 120, of each conductive pad 131 in the wiring substrate 100 is less than or equal to 30 times the minimum distance L2 between the edge of the pad and the edge of the conductive layer 130.

The embodiments in which the device region AA included in the wiring substrate 100 includes a single device sub-region A1 and a single control region A2 are described above. An example where the device region AA includes at least two device sub-regions A1 and a single control region A2 will be described below.

Figure 8:
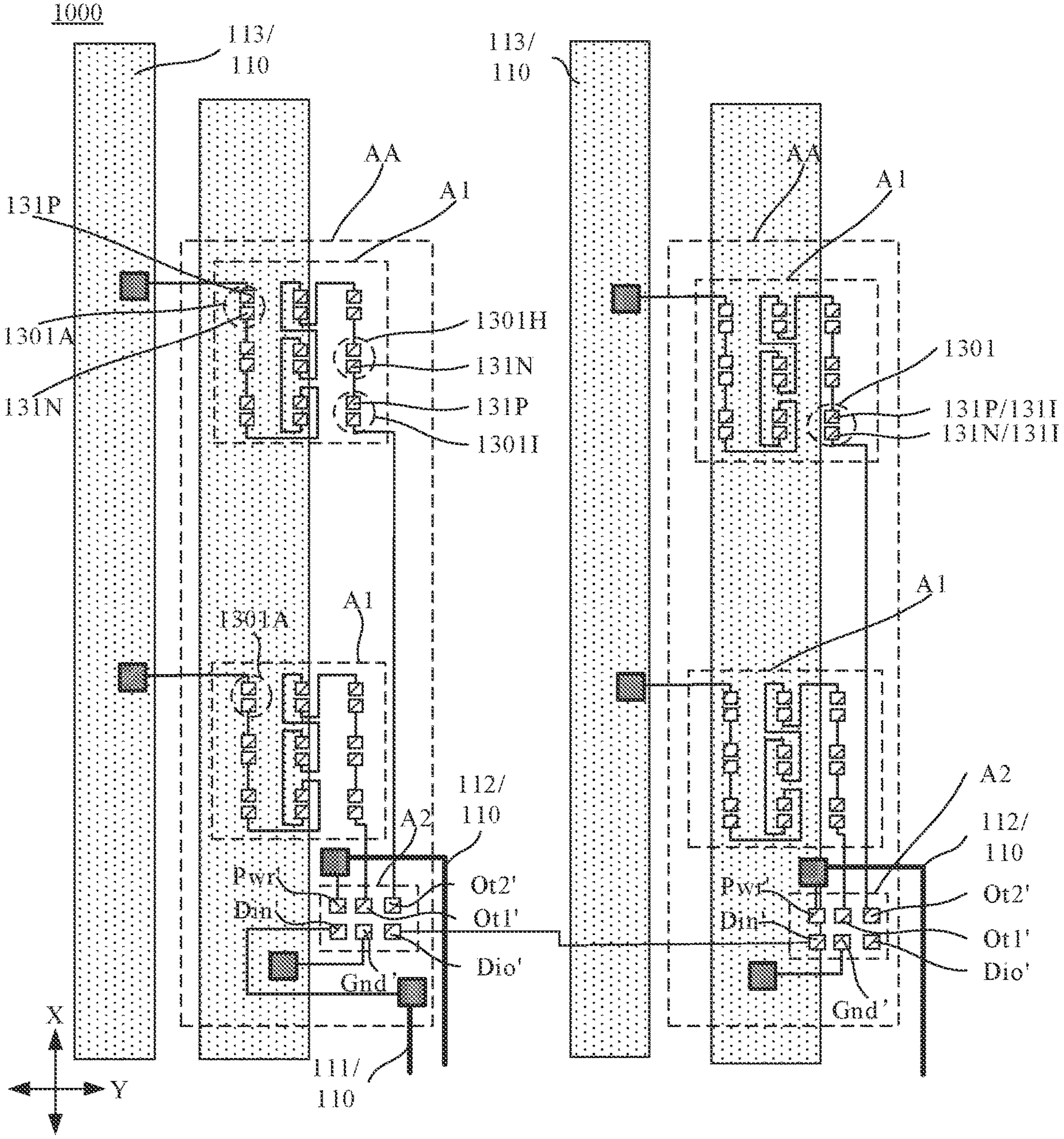
FIG. 8 is a structural diagram of yet another wiring substrate, in accordance with some embodiments.

FIG. 8 is a structural diagram of the wiring substrate 100, in accordance with some other embodiments.

Referring to FIG. 8, in some other examples, the device region AA includes at least two device sub-regions A1 and a single control region A2.

The plurality of pad groups 1300 include first pad groups 1301 located in any device sub-region A1, and the first pad groups 1301 each include a first electrode pad 131P and a second electrode pad 131N that are spaced apart from each other. The first pad groups 1301 are each used for being connected to a functional element 200.

The plurality of pad groups 1300 further include a second pad group 1302 located in the control region A2, and the second pad group 1302 includes a power supply pad Pwr', a grounding pad Gnd', an address input pad Din', an address output pad Dio' and at least two output pads (an output pad Ot1' and an output pad Ot2'). The power supply pad Pwr' is electrically connected to the source voltage line 112. In two different device regions AA, an address output pad Dio' in a control region A2 in a device region AA is connected to an address input pad Din' in a control region A2 in the other device region AA.

In the first pad groups 1301 in the same device sub-region A1, a first electrode pad 131P of a first first pad group 1301A is electrically connected to the driving voltage line 113, a second electrode pad 131N of a former first pad group 1301 is electrically connected to a first electrode pad 131P of a latter first pad group 1301, and a second electrode pad 131N of a last first pad group 1301I is electrically connected to an output pad Otx'; where x may be a positive integer greater than or equal to 2. A second electrode pad 131N of a last first pad group 1301I in each device sub-region A1 of the device sub-regions A1 is connected to a respective output pad Otx' in the control region A2. For example, in a case where the device region AA includes two device sub-regions A1, a second electrode pad 131N of a last first pad group 1301I in a device sub-region A1 is connected to the output pad Ot1', and a second electrode pad 131N of a last first pad group 1301I in the other device sub-region A1 is connected to the output pad Ot2'.

A maximum dimension, in the direction parallel to the substrate 120, of at least the first electrode pad 131P of the first first pad groups 1301A is less than or equal to 30 times a minimum distance between an edge of the first electrode pad 131P and an edge of a conductive layer 130.

In the same device region AA, first electrode pads 131P of first first pad groups 1301A in all device sub-regions A1 of the device sub-regions A1 are connected in parallel. It can be seen from above that the greater the number of conductive pads 131 that are connected in parallel in a conductive line 110, the faster a speed of a replacement reaction of the conductive pads 131 in the conductive line 110 (that is, the faster the speed of forming the Pd layer), and thus the easier it is to form the oxidation prevention layer 170 and the conductive functional layer 180 in the subsequence process. Therefore, the abnormal growth phenomenon is more prone to occur in a region (i.e., an exposed region of a respective level difference structure 1101), lacking of the protection from the protective layer, around the first electrode pad 131P of the first first pad group 1301A.

The maximum dimension L1, in the direction parallel to the substrate 120, of the first electrode pad 131P of the first first pad group 1301A is less than or equal to 30 times the minimum distance between the edge of the first electrode pad 131P and the edge of the conductive layer 130. Thus, it is possible to ameliorate the abnormal growth phenomenon occurring in the region, lacking of the protection from the protective layer, around the first electrode pad 131P of the first first pad group 1301A.

In some other embodiments, the wiring substrate 100 may include a single device region AA, and the device region AA includes a plurality of device sub-regions A1 and a single control region A2.

The plurality of pad groups 1300 include first pad groups 1301 located in any device sub-region A1. For example, a device sub-region A1 is provided with a light-emitting branch therein.

The plurality of pad groups 1300 further include a second pad group 1302 located in the control region A2, and the second pad group 1302 includes a power supply pad Pwr', a grounding pad Gnd', an address pad Di' and a plurality of output pads Ot'. The number of output pads Ot' is equal to the number of light-emitting branches.

In the first pad groups 1301 in the same device sub-region A1, a first electrode pad 131P of a first first pad group 1301A is electrically connected to the driving voltage line 113, a second electrode pad 131N of a former first pad group 1301 is electrically connected to a first electrode pad 131P of a latter first pad group 1301, and a second electrode pad 131N of a last first pad group 1301I is electrically connected to an output pad Ot'. It will be noted that second electrode pads 131N of last first pad groups 1301I in all the device sub-regions A1 are each connected to a different output pad Ot'.

Except for the embodiments in which the second electrode pads 131N of the last first pad groups 1301I in all the device sub-regions A1 are each connected to the different output pad Ot, it may be possible to provide a single output pad Ot' in the control region A2. In this case, the second electrode pads 131N of the last first pad groups 1301I in all the device sub-regions A1 are connected to the same output pad Ot'. In this case, the second electrode pads 131N of the last first pad groups 1301I in the plurality of device sub-regions A1 are connected in parallel. As a result, the abnormal growth phenomenon is prone to occur in a region, lacking of the protection from the protective layer, around the second electrode pad 131N of the last first pad group 1301I.

In some examples, it may be possible that a maximum dimension L1, in the direction parallel to the substrate 120, of the second electrode pad 131N of the last first pad group 1301 is less than or equal to 30 times a minimum distance L2 between an edge of the conductive pad and the edge of the conductive layer 130.

Figure 9A:
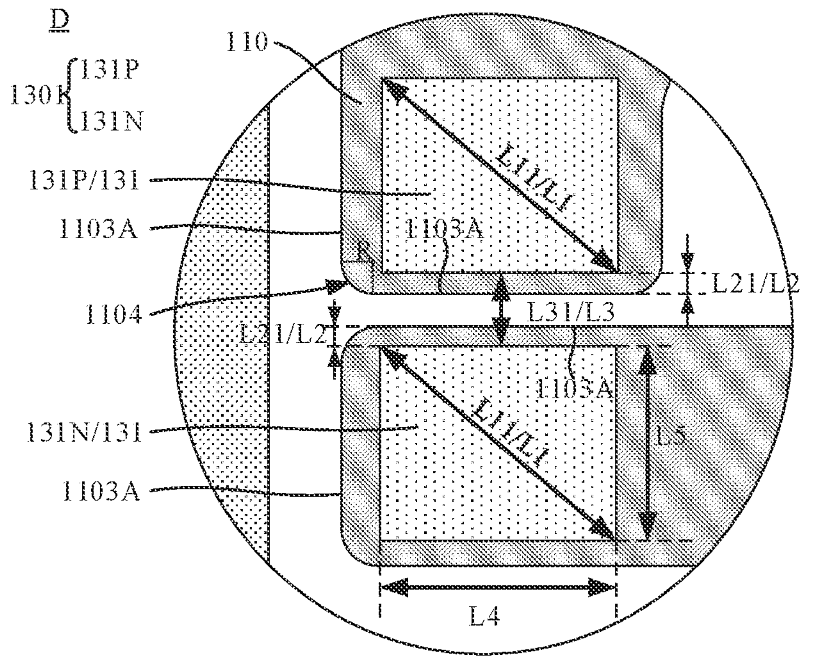
FIG. 9A is a partial enlargement view of the part D in FIG. 7.

In some examples, it may be possible that the maximum dimension L1, in the direction parallel to the substrate 120, of the first electrode pad 131P of the first first pad group 1301A is less than or equal to 30 times the minimum distance L2 between the edge of the pad and the edge of the conductive layer 130, and/or the maximum dimension L1, in the direction parallel to the substrate 120, of the second electrode pad 131N of the last first pad group 1301 is less than or equal to 30 times the minimum distance L2 between the edge of the pad and the edge of the conductive layer 130. FIG. 9A is a partial enlargement view of the part D in FIG. 7, and FIG. 9A shows a single first pad group 1301.

In some examples, a maximum dimension L11, in the direction parallel to the substrate 120, of a conductive pad 131 of the first pad group 1301 is greater than or equal to 1.5 times a minimum distance L21 between an edge of the conductive pad 131 and the edge of the conductive layer 130, and less than or equal to 28 times the minimum distance L21 between the edge of the conductive pad 131 and the edge of the conductive layer 130. That is, $1.5 \cdot L21 \leq L11 \leq 28 \cdot L21$. It will be understood that, in some examples, the conductive pad 131 of the first pad group 1301 refers to each of the first electrode pad 131P and the second electrode pad 131N.

Since L11≤28. L21, the maximum dimension L11, in the direction parallel to the substrate 120, of the conductive pad 131 of the first pad group 1301 is relatively small. Therefore, the consumption speed of $Pd^{2+}$, in the reaction region corresponding to the conductive pad 131 of the first pad group 1301, in the activation solution may be relatively slow, and the diffusion speed of $Pd^{2+}$ is relatively slow, which may reduce the speed of depositing the Pd layer on the exposed level difference structure 1101 around the conductive pad 131 of the first pad group 1301 and the speed of catalyzing the growths of the oxidation prevention layer 170 and the conductive functional layer 180 in the subsequence process, so that the abnormal growth phenomenon is ameliorated or even avoided.

In addition, $L11 \geq 1.5 \cdot L21$. Therefore, it is possible to prevent the maximum dimension L11, in the direction parallel to the substrate 120, of the conductive pad 131 of the first pad group 1301 from being too small (e.g., less than $1.5 \cdot L21$), so that the reliability of the connection between the conductive pad 131 and the pin of the functional element 200 is ensured.

For example, $2.3 \cdot L21 \leq L11 \leq 28 \cdot L21$.

For example, $3 \cdot L21 \leq L11 \leq 10 \cdot L21$.

For example, $2.3 \cdot L21 \leq L11 \leq 7 \cdot L21$.

For example, $9 \cdot L21 \leq L11 \leq 28 \cdot L21$.

For example, $2 \cdot L21 \leq L11 \leq 15 \cdot L21$.

For example, 12 μm≤L21≤50 μm.

Figure 9B:
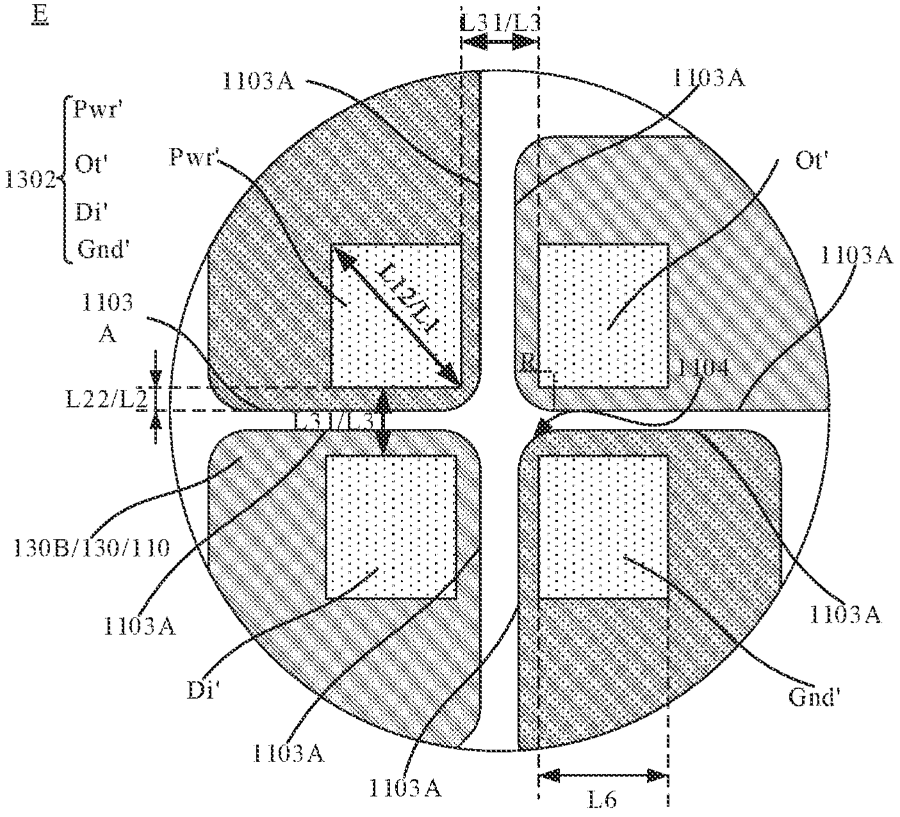
FIG. 9B is a partial enlargement view of the part E in FIG. 7.

FIG. 9B is a partial enlargement view of the part E in FIG. 7.

Referring to FIG. 9B, in some examples, a maximum dimension L12, in the direction parallel to the substrate 120, of a conductive pad 131 of the second pad group 1302 is greater than or equal to 1.5 times a minimum distance L22 between an edge of the conductive pad 131 and an edge of a conductive layer 130, and less than or equal to 26 times the minimum distance L22 between the edge of the conductive pad 131 and the edge of the conductive layer 130. That is, $1.5 \cdot L22 \leq L12 \leq 26 \cdot L22$. It will be understood that, in some examples, the conductive pad 131 of the second pad group 1302 refers to the power supply pad Pwr', the grounding pad Gnd', the address pad Di' or the output pad Ot'.

Since $L12 \leq 26 \cdot L22$, the maximum dimension L12, in the direction parallel to the substrate 120, of the conductive pad 131 of the second pad group 1302 is relatively small. Therefore, the consumption speed of $Pd^{2+}$, in the reaction region corresponding to the conductive pad 131 of the second pad group 1302, in the activation solution may be relatively slow, and the diffusion speed of $Pd^{2+}$ is relatively slow, which may reduce the speed of depositing the Pd layer on the exposed level difference structure 1101 around the conductive pad 131 of the second pad group 1302 and the speed of catalyzing the growths of the oxidation prevention layer 170 and the conductive functional layer 180 in the subsequence process, so that the abnormal growth phenomenon is ameliorated or even avoided.

In addition, $L12 \geq 1.5 \cdot L22$. Therefore, it is possible to prevent the maximum dimension L12, in the direction parallel to the substrate 120, of the conductive pad 131 of the second pad group 1302 from being too small (e.g., less than 1.5. L22), so that the reliability of the connection between the conductive pad 131 and the driving chip 300 is ensured.

For example, $1.5 \cdot L22 \leq L12 \leq 5 \cdot L22$.

For example, $5 \cdot L22 \leq L12 \leq 11 \cdot L22$.

For example, $2.5 \cdot L22 \leq L12 \leq 5.5 \cdot L22$.

For example, $2.5 \cdot L22 \leq L12 \leq 7 \cdot L22$.

For example, $2.5 \cdot L22 \leq L12 \leq 15 \cdot L22$.

For example, $15 \cdot L22 \leq L12 \leq 25 \cdot L22$.

For example, 7 μm≤L22≤50 μm.

With continued reference to FIGS. 9A and 9B, in some embodiments, of a same pad group 1300, a maximum dimension L1 of a conductive pad 131 in the direction parallel to the substrate 120 is 0.5 to 5 times a distance L3 between the conductive pad 131 and a conductive pad 131 adjacent thereto. That is, $0.5 \cdot L3 \leq L1 \leq 5 \cdot L3$. The two adjacent conductive pads 131 are located in the same pad group 1300. The distance L3 between the conductive pad 131 and the conductive pad 131 adjacent thereto is a minimum distance between the two.

In some examples, the two adjacent conductive pads 131 of the same pad group 1300 may be disposed in two conductive lines 110, respectively. In this case, the distance between the two adjacent conductive pads 131 may be affected by a distance between the two conductive lines 110 where the two adjacent conductive pads 131 are respectively located. In this case, the greater the distance between the conductive lines 110 where the two adjacent conductive pads 131 are respectively located, the greater the distance between the two adjacent conductive pads 131.

In some other examples, the two adjacent conductive pads 131 of the same pad group 1300 may be located in a same conductive line 110. For example, a driving chip 300 includes two grounding pins Gnd, and correspondingly, a second pad group 1302 to which the driving chip 300 is connected includes two grounding pads Gnd'. The grounding pins Gnd of the driving chip 300 are spaced apart from each other, and thus the two grounding pads Gnd' are provided with a space therebetween. In this case, the two grounding pads Gnd' may be disposed in the same conductive line 110. In this case, the two grounding pads Gnd' are adjacent, and shapes of the two grounding pads Gnd' and the space between the two may be limited by a line width and/or a line length of the conductive line 110 where the two grounding pads Gnd' are located. In this case, the less the line width and/or the line length of the conductive line 110 where the two grounding pads Gnd' are located, the less the distance between the two grounding pads Gnd'.

It will be understood that a relative position relationship between all conductive pads of any first pad group is substantially the same as a relative position relationship between all pins of an electronic element to be connected to the first pad group, and a relative position relationship between all conductive pads of any second pad group is substantially the same as a relative position relationship between all pins of an electronic element to be connected to the second pad group.

Since $0.5 \cdot L3 \leq L1 \leq 5 \cdot L3$, it is possible to prevent the maximum dimension L1 from being too large (e.g., greater than 5. L3). Therefore, the consumption speed of $Pd^{2+}$ in the reaction region in the activation solution may be relatively slow, and the diffusion speed of $Pd^{2+}$ in the solution is relatively slow, which may reduce the speed of depositing the Pd layer on the exposed level difference structure 1101 and the speed of catalyzing the growths of the oxidation prevention layer 170 and the conductive functional layer 180 in the subsequence process, so that the abnormal growth phenomenon is ameliorated or even avoided. In addition, it is possible to prevent the maximum dimension L1 from being too small (e.g., less than 0.5. L3), so that the reliability of the connection between the conductive pad 131 and the electronic element is ensured.

Referring to FIGS. 9A and 9B, in some embodiments, the maximum dimension L1 of the conductive pad 131 in the direction parallel to the substrate 120 is greater than or equal to 105 μm, and less than or equal to 350 μm.

Since 105 μm≤L1≤350 μm, it is possible to prevent the value of the maximum dimension L1 from being too large (e.g., greater than 350 μm). It can be seen from above that, the greater the maximum dimension L1, the faster the consumption speed of $Pd^{2+}$ in the reaction region in the activation solution. Therefore, in the embodiments of the present disclosure, by making L1≤350 μm, the consumption speed of $Pd^{2+}$ in the reaction region in the activation solution may be relatively slow, and the diffusion speed of $Pd^{2+}$ is relatively slow, which may reduce the speed of depositing the Pd layer on the exposed level difference structure 1101 and the speed of catalyzing the growths of the oxidation prevention layer 170 and the conductive functional layer 180 in the subsequence process, so that the abnormal growth phenomenon is ameliorated or even avoided.

In addition, it is possible to avoid a relatively low reliability, caused by a fact that the maximum dimension L1 is too small (e.g., less than 105 μm), of the connection between the conductive pad 131 and the pin of the electronic element. It will be noted that "the electronic element" here includes the functional element 200 or the driving chip 300. In some embodiments of the present disclosure, the maximum dimension L1 is greater than or equal to 105 μm, so that the reliability of the connection between the conductive pad 131 and the pin of the electronic element may be endured.

Referring to FIG. 9A, in some examples, the maximum dimension L11, in the direction parallel to the substrate 120, of the conductive pad 131 of the first pad group 1301 is greater than or equal to 105 μm, and less than or equal to 350 μm.

In some examples, the minimum distance L2 between the edge of the conductive pad 131 and the edge of the conductive layer 130 is greater than or equal to 7 μm, and less than or equal to 50 μm.

For example, the conductive pad 131 of the first pad group 1301 is in a shape of a rectangle.

In some examples, a length L4 of the conductive pad 131 of the first pad group 1301 is greater than or equal to 2. L21, and less than or equal to 25. L21.

In some examples, the length L4 of the conductive pad 131 of the first pad group 1301 is greater than or equal to 80 μm, and less than or equal to 280 μm.

For example, a value of the length L4 may be 102 μm, 162 μm, 264 μm, etc.

In some examples, a width L5 of the conductive pad 131 of the first pad group 1301 is greater than or equal to the minimum distance L21, and less than or equal to 20. L21.

In some examples, the width L5 of the conductive pad 131 of the first pad group 1301 is greater than or equal to 45 μm, and less than or equal to 220 μm.

For example, a value of the width L5 may be 62 μm, 122 μm, 205 μm, etc.

For example, 12 μm≤L21≤50 μm.

Referring to FIG. 9B, in some examples, the maximum dimension L12, in the direction parallel to the substrate 120, of the conductive pad 131 of the second pad group 1302 is greater than or equal to 105 μm, and less than or equal to 190 μm.

In some examples, the conductive pad 131 of the second pad group 1302 is in a shape of a square. In this case, a side length L6 of the conductive pad 131 of the second pad group 1302 is greater than or equal to 1.5. L22, and less than or equal to 20. L22.

In some examples, the side length L6 is greater than or equal to 70 μm, and less than or equal to 140 μm.

For example, a value of the side length L6 may be 82 μm, 92 μm, 122 μm, etc.

For example, 7 μm≤L22≤50 μm.

In some embodiments, a magnitude of an area of a conductive pad 131 in at least two pad groups 1300 is positive correlated with a distance L3 between two adjacent conductive pads 131.

It will be understood that the greater an area of a conductive pad 131, the greater a distance L3 between the conductive pad 131 and a conductive pad 131 adjacent thereto.

The greater the distance L3 between the two adjacent conductive pads 131, the larger the reaction region to which the pad group 1300 where the two adjacent conductive pads 131 are located corresponds, and in this case, the slower the consumption speed of $Pd^{2+}$ in the reaction region to which the pad group 1300 corresponds. The greater the area of the conductive pad 131, the faster the consumption speed of $Pd^{2+}$ in the reaction region to which the conductive pad 131 corresponds, and thus the faster the consumption speed of $Pd^{2+}$ in the reaction region to which the pad group 1300 where the conductive pad 131 is located corresponds.

Therefore, in the embodiments of the present disclosure, in a case where the area of the conductive pad 131 is relatively large, the distance L3 between the conductive pad 131 and the conductive pad 131 adjacent thereto is relatively large, which may reduce the consumption speed of $Pd^{2+}$ in the reaction region to which the pad group 1300 where the conductive pad 131 is located corresponds, so that the diffusion speed of $Pd^{2+}$ in the solution may be reduced. As a result, it is possible to reduce the speed of depositing the Pd layer on the exposed level difference structure 1101 and the speed of catalyzing the growths of the oxidation prevention layer 170 and the conductive functional layer 180 in the subsequence process, so that the abnormal growth phenomenon is ameliorated or even avoided.

In some examples, in two designated pad groups 1300, an area of a conductive pad 131 of a pad group 1300 is greater than an area of a conductive pad 131 of the other pad group 1300, and a distance L3 between the conductive pad 131 of which an area is relatively large and a conductive pad 131 adjacent thereto is greater than a distance L3 between two adjacent conductive pads 131 of the other pad group 1300.

In some other examples, in other two designated pad groups 1300, an area of a conductive pad 131 of a pad group 1300 is greater than an area of a conductive pad 131 of the other pad group 1300, and a distance L3 between the conductive pad 131 of which an area is relatively large and a conductive pad 131 adjacent thereto is less than a distance L3 between two adjacent conductive pads 131 of the other pad group 1300.

In some embodiments, an area of a conductive pad 131 is greater than or equal to 5000 $\mu m^2$, and less than or equal to 55000 $\mu m^2$.

It is possible to prevent the area of the conductive pad 131 from being too large by controlling the area of the conductive pad 131 to be less than or equal to 55000 $\mu m^2$. Thus, the consumption speed of $Pd^{2+}$ in the reaction region in the activation solution may be relatively slow, and the diffusion speed of $Pd^{2+}$ in the solution is relatively slow, which may reduce the speed of depositing the Pd layer on the exposed level difference structure 1101 and the speed of catalyzing the growths of the oxidation prevention layer 170 and the conductive functional layer 180 in the subsequence process, so that the abnormal growth phenomenon is ameliorated or even avoided.

In addition, the area of the conductive pad 131 is greater than or equal to 5000 $\mu m^2$, which may prevent the area of the conductive pad 131 from being too small, so that the reliability of the connection between the conductive pad 131 and the pin of the electronic element may be ensured.

In some examples, an area of the conductive pad 131 of the first pad group 1301 is greater than or equal to 5000 $\mu m^2$, and less than or equal to 55000 $\mu m^2$. For example, the area of the conductive pad 131 of the first pad group 1301 is greater than or equal to 6200 $\mu m^2$, and less than or equal to 54700 $\mu m^2$.

In some examples, an area of the conductive pad 131 of the second pad group 1302 is greater than or equal to 5500 $\mu m^2$, and less than or equal to 15500 $\mu m^2$.

For example, the area of the conductive pad 131 of the second pad group 1302 is greater than or equal to 6600 $\mu m^2$, and less than or equal to 15000 $\mu m^2$.

In some embodiments, of a same pad group 1300, a distance L3 between two adjacent conductive pads 131 is greater than or equal to 70 μm, and less than or equal to 214 μm. That is, 70 μm≤L3≤214 μm.

It can be seen from above that the greater a value of the distance L3, the slower the consumption speed of $Pd^{2+}$ in the reaction region in the activation solution. In the embodiments of the present disclosure, L3≥70 μm, which may prevent the distance L3 from being too small (e.g., less than 70 μm), so that the consumption speed of $Pd^{2+}$ in the reaction region in the activation solution and the diffusion speed of $Pd^{2+}$ in the solution may be both relatively slow. As a result, it is possible to reduce the speed of depositing the Pd layer on the exposed level difference structure 1101 and the speed of catalyzing the growths of the oxidation prevention layer 170 and the conductive functional layer 180 in the subsequence process, so that the abnormal growth phenomenon is ameliorated or even avoided.

In addition, L3≤214 μm, so that it is possible to avoid a too large area of the wiring substrate 100 caused by a fact that L3 that is too large (e.g., greater than 214 μm) results in a too large distance between the two adjacent conductive pads 131 and a too large area occupied by the pad group 1300 where the two conductive pads 131 are located.

In the above embodiments, a solution in which the abnormal growth phenomenon may be ameliorated by reducing the area of the conductive pad 131 and/or improving the distance between the two adjacent conductive pads 131 are described. In addition, the abnormal growth phenomenon may be ameliorated by using other solutions.

A relationship between the area of the conductive pad 131 and a size of the pin of the electronic element to which the conductive pad 131 is connected will be described below.

Figure 10:
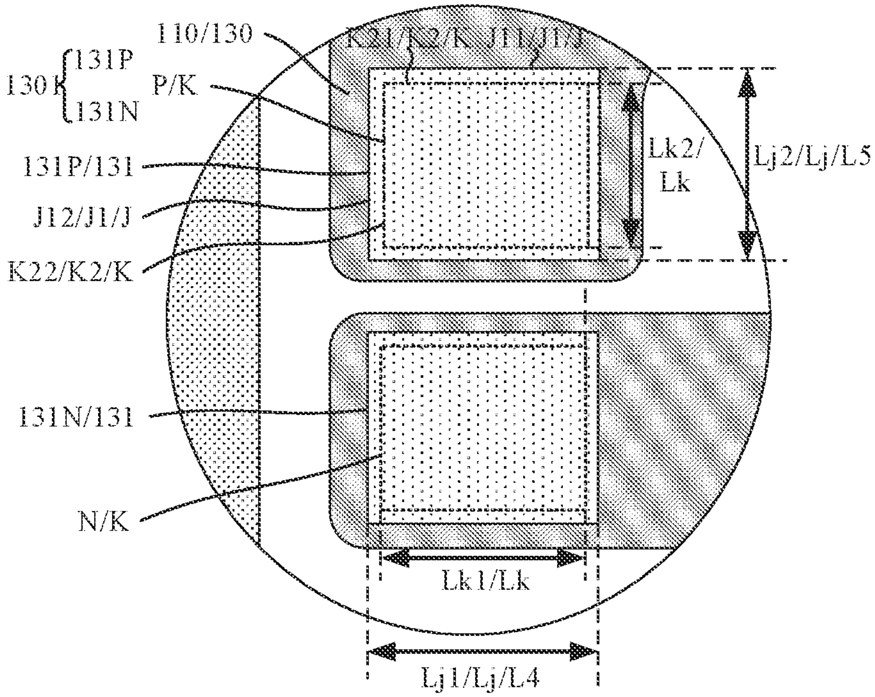
FIG. 10 is a structural diagram of yet another wiring substrate, in accordance with some embodiments.

FIG. 10 is a structural diagram of the wiring substrate 100, in accordance with some embodiments. A dotted box indicated by P is a region covered by an orthographic projection of the first pin P of the functional element 200 on the conductive layer 130. A dotted box indicated by N is a region covered by an orthographic projection of the second pin N of the functional element 200 on the conductive layer 130.

In some examples, a shape of a pattern formed by an orthographic projection, on the substrate 120, of the conductive pad 131 is substantially the same as a shape of a pattern formed by an orthographic projection, on the substrate 120, of the pin of the electronic element to which the conductive pad 131 is connected. For convenience of description, the pattern formed by the orthographic projection, on the substrate 120, of the conductive pad 131 is defined as a first pattern J, and the pattern formed by the orthographic projection, on the substrate 120, of the pin of the electronic element is defined as a second pattern K. In addition, it will be understood that the conductive pad 131 is the first electrode pad 131P or the second electrode pad 131N of the first pad group 1301. Alternatively, the conductive pad 131 may be any one of the power supply pad Pwr', the grounding pad Gnd', the address pad Di' and the output pad Ot' of the second pad group 1302. The pin of the electronic element may be the first pin P or the second pin N of the functional element 200. Alternatively, the pin may be any one of the power supply pin Pwr, the grounding pin Gnd, the address pin Di and the output pin Ot of the driving chip 300.

The second pattern K is located within the first pattern J. For example, the first pattern J and the second pattern K are each in a shape of a rectangle.

In some examples, the first pattern J includes at least one first edge J1. It will be noted that, in a case where the first pattern J includes a single first edge J1, the first pattern J is in a shape of a circle. In addition, in a case where the first pattern J is in a shape of a rectangle, lengths of some of first edges J1 of the first pattern J are unequal. In a case where the first pattern J is in a shape of a square, lengths of all first edges J1 of the first pattern J are equal.

The second pattern K includes at least one second edge K2. A first edge J1 is arranged corresponding to a second edge K2. It will be noted that, in a case where the second pattern K includes a single second edge K2, the second pattern K is in a shape of a circle. In a case where the second pattern K is in a shape of a rectangle, lengths of some of second edges K2 of the second pattern K are unequal. In a case where the second pattern K is in a shape of a square, lengths of all second edges K2 of the second pattern K are equal.

In the first edge J1 and the second edge K2 that are arranged corresponding to each other, a difference between a length Lj of the first edge J1 and a length Lk of the second edge K2 is greater than or equal to 2 μm, and less than or equal to 4 μm. That is, 2 μm≤(Lj−Lk)≤4 μm. The length Lj of the first edge J1 is greater than the length Lk of the second edge K2.

The first edge J1 and the second edge K2 are described below by taking an example where the conductive pad 131 is the first electrode pad 131P or the second electrode pad 131N of the first pad group 1301.

Of the same first pad group 1301, a pattern formed by an orthographic projection, on the substrate 120, of the first electrode pad 131P and a pattern formed by an orthographic projection, on the substrate 120, of the second electrode pad 131N have a same shape and an equal size. It will be understood that the phrase "having the same shape and the equal size" refers to that the pattern formed by the orthographic projection of the first electrode pad 131P on the substrate 120 may completely overlap, after being moved by a designated distance, with the pattern formed by the orthographic projection of the second electrode pad 131N on the substrate 120.

Referring to FIG. 10, the first pattern J includes two first first edges J11 and two second first edges J12, and a length of the first first edge J11 is greater than a length of the second first edge J12. The second pattern K includes two first second edges K21 and two second second edges K22, and a length of the first second edge K21 is greater than a length of the second second edge K22. A first first edge J11 is arranged corresponding to a first second edge K21, and a second first edge J12 is arranged corresponding to a second second edge K22.

A difference between the length Lj1 of the first first edge J11 and the length Lk1 of the first second edge K21 is greater than or equal to 2 μm, and less than or equal to 4 μm. That is, $2\ \mu m \le (Lj1-Lk1) \le 4\ \mu m$. A difference between the length Lj2 of the second first edge J12 and the length Lk2 of the second second edge K22 is greater than or equal to 2 μm, and less than or equal to 4 μm. That is, $2\ \mu m \le (Lj2-Lk2) \le 4\ \mu m$.

In the first edge J1 and the second edge K2 that are arranged corresponding to each other, the difference between the length Lj of the first edge J1 and the length Lk of the second edge K2 is less than or equal to 4 μm, which may avoid a too large area of the conductive pad 131 of the first pad group 1301 caused by a fact that the length of the first edge J1 is too large. Thus, the consumption speed of $Pd^{2+}$ in the reaction region in the activation solution may be relatively slow, and the diffusion speed of $Pd^{2+}$ in the solution is relatively slow. As a result, it is possible to reduce the speed of depositing the Pd layer on the exposed level difference structure 1101 and the speed of catalyzing the growths of the oxidation prevention layer 170 and the conductive functional layer 180 in the subsequence process, so that the abnormal growth phenomenon is ameliorated or even avoided. In addition, in the first edge J1 and the second edge K2 that are arranged corresponding to each other, the difference between the length Lj of the first edge J1 and the length Lk of the second edge K2 is greater than or equal to 2 μm, which may avoid a problem, caused by a too small area of the conductive pad 131 due to a too small length Lj of the first edge J1, that the reliability of the connection between the conductive pad 131 of the first pad group 1301 and the pin of the functional element 200 cannot be ensured.

It can be seen from above that the wiring substrate 100 may include two conductive layers 130 or one conductive layer. The conductive pad 131 in the wiring substrate 100 will be described below based on the embodiments in which the wiring substrate 100 includes one conductive layer 130.

Figure 11:
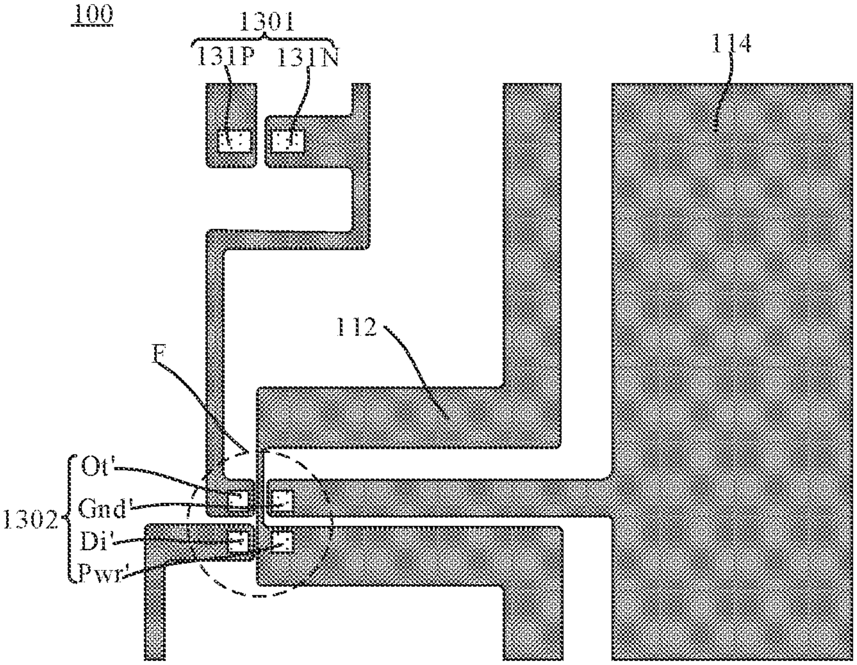
FIG. 11 is a structural diagram of yet another wiring substrate, in accordance with some embodiments.
Figure 12:
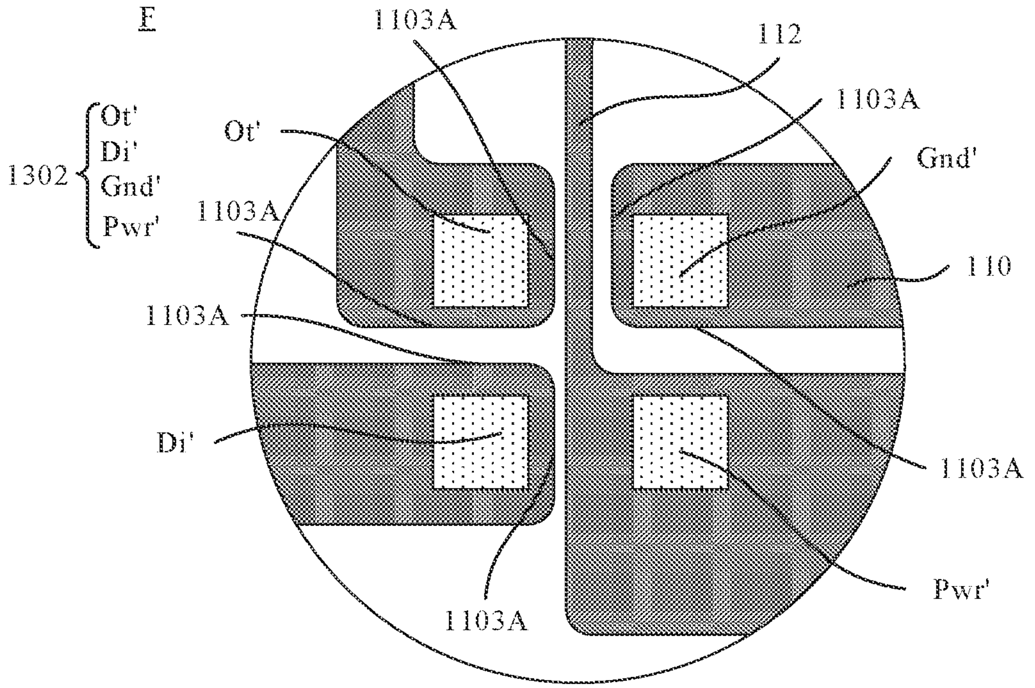
FIG. 12 is a partial enlargement view of the part F in FIG. 11.

FIG. 11 is a structural diagram of the wiring substrate 100, in accordance with some embodiments. FIG. 12 is a partial enlargement view of the part F in FIG. 11.

Referring to FIGS. 11 and 12, the power supply pad Pwr' of the second pad group 1302 is located in the source voltage line 112, and the source voltage line 112 passes through a gap between the grounding pad Gnd' and the output pad Ot'.

In some examples, the grounding pad Gnd' and the address pad Di' are respectively opposite to two adjacent edges of the output pad Ot'. In addition, the grounding pad Gnd' and the address pad Di' are also respectively opposite to two adjacent edges of the power supply pad Pwr'.

Figure 13:
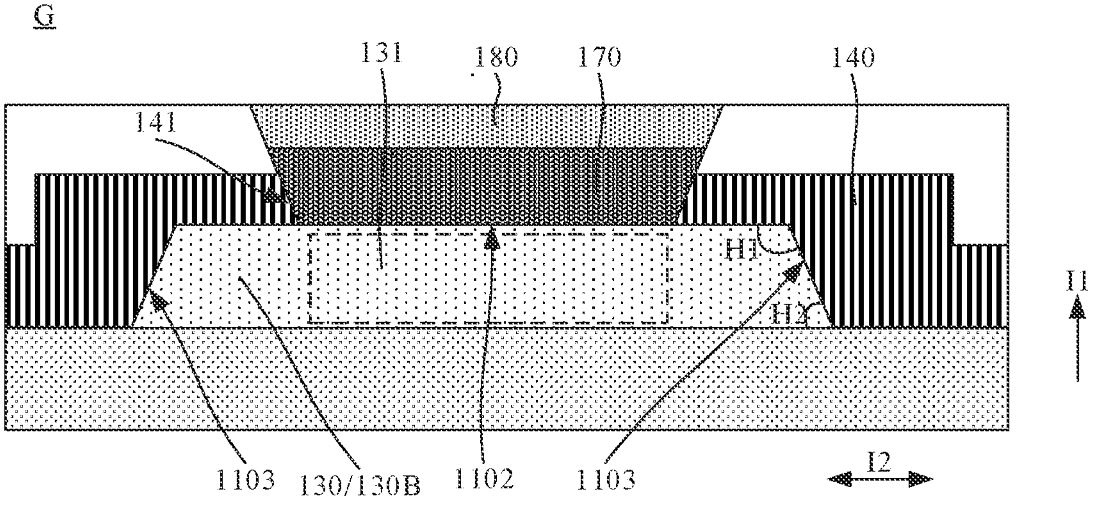
FIG. 13 is a partial enlargement view of the part G in FIG. 2A.

FIG. 13 is a partial enlargement view of the part G in FIG. 2A.

In some embodiments, the conductive layer 130 includes a plurality of conductive lines 110, and a region of a conductive line 110 exposed by an opening 141 is a conductive pad 131. In a section perpendicular to both the substrate and an extending direction of the conductive line 110, a main surface 1102 of the conductive line 110 and side surfaces 1103 each connected to the main surface 1102 may be observed, and the main surface 1102 is a surface of the conductive line 110 away from the substrate 120; an included angle H1 between the main surface 1102 and the side surface 1103 is greater than or equal to 105°, and less than or equal to 145°.

The greater the included angle H1 between the main surface 1102 and the side surface 1103, the easier it is to form the level difference structure 1101, and thus the easier it is to expose an edge of the conductive line 110.

In the embodiments of the present disclosure, the included angle H1 between the main surface 1102 and the side surface 1103 is greater than or equal to 105°, which may prevent the included angle H1 from being too small (e.g., less than) 105°, so that the included angle H1 may be relatively small. As a result, a probability of forming the level difference structure 1101 is relatively small, which may make a probability that the edge of the conductive line 110 is exposed relatively small, so that the abnormal growth phenomenon may be ameliorated.

In addition, an included angle H2 between the side surface 1103 and the substrate 120 is complementary to the included angle H1 between the main surface 1102 and the side surface 1103. That is, $H1+H2=180°$. The included angle H2 refers to an acute angle between the side surface 1103 and the substrate 120. Thus, the greater the included angle H2, the less the included angle H1. The less the included angle H2 between the side surface 1103 and the substrate 120, the better a covering effect of the protective layer 140 on the side surface 1103, and thus the more difficult it is to expose the conductive line 110. In the embodiments of the present disclosure, the included angle H1 between the main surface 1102 and the side surface 1103 is greater than or equal to 105°, so that the included angle H2 between the side surface 1103 and the substrate 120 may be less than or equal to 75°. Therefore, it is possible to prevent the included angle between the side surface 1103 and the substrate 120 from being too large (e.g., greater than) 75°, which may ensure the covering effect of the protective layer 140 on the side surface 1103, so that the probability that the conductive line 110 is exposed may be reduced. As a result, it is possible to ameliorate the abnormal growth phenomenon.

In some embodiments of the present disclosure, the included angle H1 between the main surface 1102 and the side surface 1103 is less than or equal to 145°, so that it is possible to avoid a problem, caused by a fact that the included angle H1 is too large (e.g., greater than) 145°, that a process difficulty is relatively high.

In some examples, the included angle H1 between the main surface 1102 and the side surface 1103 is greater than or equal to 115°, and less than or equal to 140°.

With continued reference to FIG. 9A, in some embodiments, at least two side surfaces 1103, that each have a relatively small distance to the conductive pad 131 in the conductive line 110, of a plurality of side surfaces 1103 are each a first side surface 1103A, and two first side surfaces 1103A are connected to each other via a curved surface.

In some examples, the conductive line 110 has two first side surfaces 1103A each having a relatively small distance to the conductive pad 131. A distance between each of the two first side surfaces 1103A and an edge of the conductive pad 131 is less than a distance between another side surface 1103 and the edge of the conductive pad 131. It will be noted that the distance between each of the two first side surfaces 1103A and the edge of the conductive pad 131 may be equal or unequal.

Referring to FIG. 9A, a first side surface 1103A of a conductive line 110 where the first electrode pad 131P is located and a first side surface 1103A of a conductive line 110 where the second electrode pad 131N is located are both located between the first electrode pad 131P and the second electrode pad 131N.

In some examples, side surfaces 1103 to which two ends of the first side surface 1103A located between the first electrode pad 131P and the second electrode pad 131N are connected are both the first side surfaces 1103A.

Referring to FIG. 9B, two first side surfaces 1103A of a conductive line 110 where the power supply pad Pwr' is located are respectively located between the power supply pad Pwr' and the output pad Ot', and the power supply pad Pwr' and the address pad Di'.

Two first side surfaces 1103A of a conductive line 110 where the output pad Ot' is located are respectively located between the output pad Ot' and the power supply pad Pwr', and the output pad Ot' and the grounding pad Gnd'.

Two first side surfaces 1103A of a conductive line 110 where the grounding pad Gnd' is located are respectively located between the grounding pad Gnd' and the output pad Ot', and the grounding pad Gnd' and the address pad Di'.

Two first side surfaces 1103A of a conductive line 110 where the address pad Di' is located are respectively located between the address pad Di' and the grounding pad Gnd', and the address pad Di' and the power supply pad Pwr'.

Referring to FIG. 12, in a case where the source voltage line 112 passes through the gap between the grounding pad Gnd' and the output pad Ot', two first side surfaces 1103A of the conductive line 110 where the output pad Ot' is located are respectively located between the output pad Ot' and the grounding pad Gnd', and the output pad Ot' and the address pad Di'; two first side surfaces 1103A of the conductive line 110 where the address pad Di' is located are respectively located between the address pad Di' and the output pad Ot', and the address pad Di' and the power supply pad Pwr'; two first side surfaces 1103A of the conductive line 110 where the grounding pad Gnd' is located are respectively located between the grounding pad Gnd' and the power supply pad Pwr', and the grounding pad Gnd' and the output pad Ot'.

Two first side surfaces 1103A are connected via a curved surface. That is, an orthographic projection, on the substrate 120, of a junction between the two first side surfaces 1103A is a first rounded corner 1104 (as shown in FIGS. 9A and 9B). Thus, it is possible to reduce the number of sharp edges, on which electrostatic accumulation is prone to occur during a process of using the backboard 1000, of the conductive line 110. In the embodiments of the present disclosure, the two first side surfaces 1103A are connected via the curved surface, so that the electrostatic accumulation in the conductive line 110 may be reduced.

In some embodiments, as shown in FIGS. 9A and 9B, a radius R of the first rounded corner 1104 is greater than or equal to 20 μm, and less than or equal to 30 μm.

In the embodiments of the present disclosure, the radius R of the first rounded corner 1104 is greater than or equal to 20 μm, so that it is possible to avoid a problem, caused by a fact that the radius R of the first rounded corner 1104 is too small (e.g., less than 20 μm), that the electrostatic accumulation cannot be effectively avoided. As a result, the conductive line 110 may have a relatively good effect of avoiding the electrostatic accumulation.

In addition, the greater the radius R of the first rounded corner 1104, the closer the edge of the conductive pad 131 is to the edge of the first rounded corner 1104. In the embodiments of the present disclosure, the radius R of the curved surface or the first rounded corner 1104 is less than or equal to 30 μm, which may prevent the radius R of the first rounded corner 1104 from being too large (e.g., greater than 30 μm), so that it is possible to prevent the distance between the edge of the conductive pad 131 and the edge of the first rounded corner 1104 from being too small.

The backboard 1000 provided in some embodiments of the present disclosure includes the wiring substrate 100 provided in the above embodiments. Therefore, the backboard 1000 provided in some embodiments of the present disclosure has all the beneficial effects of the wiring substrate 100 provided in the above embodiments, which will not be repeated here.

Figure 14:
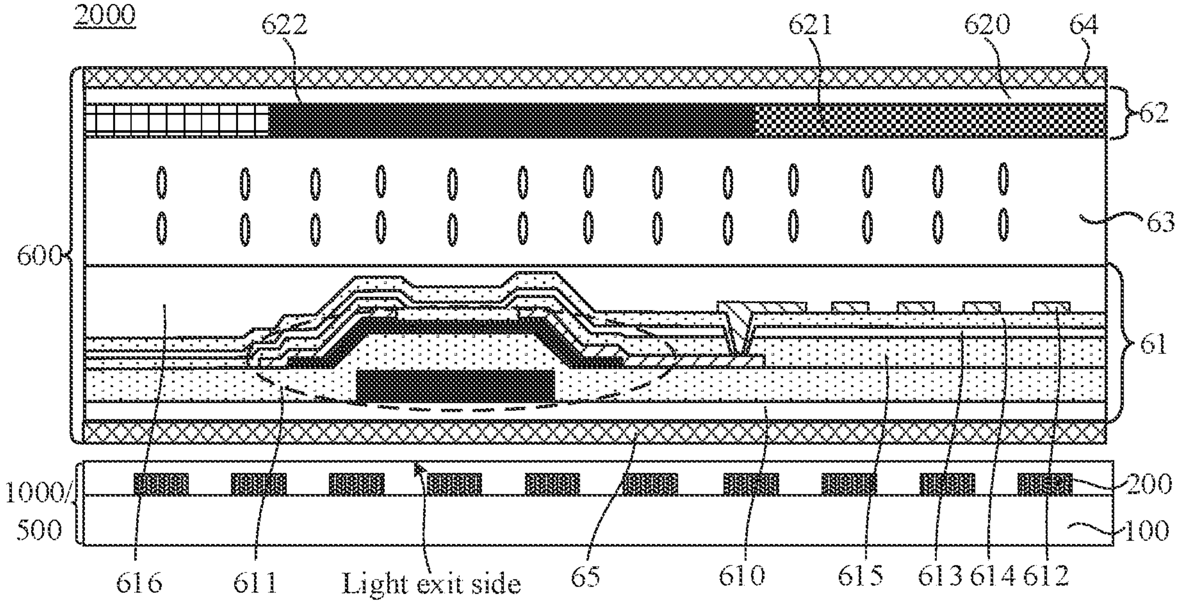
FIG. 14 is a structural diagram of a display apparatus, in accordance with some embodiments.

FIG. 14 is a structural diagram of a display apparatus 2000, in accordance with some embodiments.

Referring to FIG. 14, some embodiments of the present disclosure provide a display apparatus 2000. The display apparatus 2000 includes a backlight module 500 and a liquid crystal display panel 600. The backlight module 500 is the backboard 1000 provided in the above embodiments, and the functional elements 200 each include a light-emitting diode. The liquid crystal display panel 600 is located on a light exit side of the backlight module 500. The display apparatus 2000 provided in the embodiments of the present disclosure has all the beneficial effects of the backboard 1000 provided in the above embodiments, which will not be repeated here.

It will be understood that the display apparatus 2000 may display image information whether in motion (e.g., a video or a game interface) or stationary (e.g., an image or a picture).

Referring to FIG. 14, in some embodiments, the liquid crystal display panel 600 mainly includes an array substrate 61, an opposite substrate 62, and a liquid crystal layer 63 disposed between the array substrate 61 and the opposite substrate 62.

Each sub-pixel of the array substrate 61 includes a thin film transistor 611 and a pixel electrode 612 that are located on a first substrate 610. The thin film transistor 611 includes an active layer, a source, a drain, a gate and a gate insulating layer, the source and the drain are in contact with the active layer, and the pixel electrode 612 is electrically connected to the drain of the thin film transistor 611. In some embodiments, the array substrate 61 further includes a common electrode 613 disposed on the first substrate 610. The pixel electrode 612 and the common electrode 613 may be disposed in a same layer. In this case, the pixel electrode 612 and the common electrode 613 are each of a comb-tooth structure including a plurality of strip-shaped sub-electrodes. The pixel electrode 612 and the common electrode 613 may be disposed in different layers. In this case, as shown in FIG. 14, a first interlayer insulating layer 614 is provided between the pixel electrode 612 and the common electrode 613. In a case where the common electrode 613 is disposed between the thin film transistor 611 and the pixel electrode 612, as shown in FIG. 14, a second interlayer insulating layer 615 is provided between the common electrode 613 and the thin film transistor 611. In some other embodiments, the array substrate 61 includes no common electrode 613. In this case, the common electrode 613 may be located in the opposite substrate 62.

As shown in FIG. 14, the array substrate 61 further includes a planarization layer 616 disposed on a side of the thin film transistor 611 and the pixel electrode 612 away from the first substrate 610.

As shown in FIG. 14, the opposite substrate 62 includes a color filter layer 621 disposed on a second substrate 620. In this case, the opposite substrate 62 may be also referred to as a color filter (CF) substrate. The color filter layer 621 includes at least red photoresist units, green photoresist units and blue photoresist units, and the red photoresist units, the green photoresist units and the blue photoresist units may be directly opposite to the sub-pixels of the array substrate 61 in a one-to-one correspondence. The opposite substrate 62 further includes black matrix patterns 622 disposed on the second substrate 620, and the black matrix patterns 622 are used for spacing the red photoresist units, the green photoresist units and the blue photoresist units.

It will be understood that light may exit from the light exit side of the backlight module 500 and be cast upon the liquid crystal layer 63. An intensity of light passing through the liquid crystal layer 63 may be adjusted by adjusting an arrangement of liquid crystal molecules in the liquid crystal layer 63, so that it is possible to adjust an intensity of light cast upon the opposite substrate 62. The opposite substrate 62 includes the color filter layer 621. In this way, the display apparatus 2000 may achieve a function of displaying color images by adjusting an intensity of light cast upon a photoresist unit of a different color.

As shown in FIG. 14, the liquid crystal display panel 600 further includes an upper polarizer 64 disposed on a side of the opposite substrate 62 away from the liquid crystal layer 63, and a lower polarizer 65 disposed on a side of the array substrate 61 away from the liquid crystal layer 63.

Figure 15:
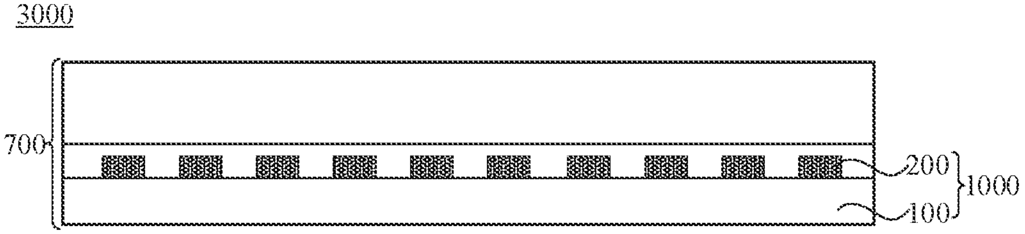
FIG. 15 is a structural diagram of another display apparatus, in accordance with some embodiments.

FIG. 15 is a structural diagram of a display apparatus 3000, in accordance with some embodiments.

Referring to FIG. 15, some embodiments of the present disclosure provide a display apparatus 3000. The display apparatus 3000 includes a display panel 700, and the display panel 700 includes the backboard 1000 provided in the above embodiments. The display apparatus 3000 provided in some embodiments of the present disclosure has all the beneficial effects of the backboard 1000 provided in the above embodiments, which will not be repeated here.

It will be understood that the display apparatus 3000 may display image information whether in motion (e.g., a video or a game interface) or stationary (e.g., an image or a picture).

In some embodiments, the display apparatus 3000 may be a light-emitting diode (LED) display, a mini light-emitting diode (Mini LED) display or a micro light-emitting diode (Micro LED) display. It will be understood that LED chips in the backboard 1000 are used for emitting red light, green light and blue light, so that the display apparatus 3000 may achieve color display.

Figure 16:
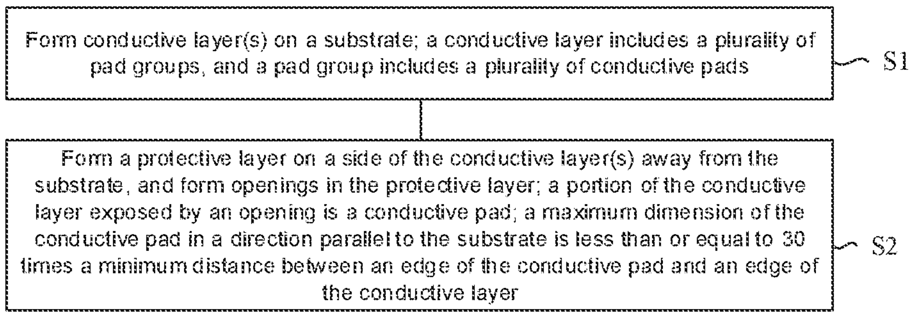
FIG. 16 is a flow diagram of a method of manufacturing a wiring substrate, in accordance with some embodiments.

FIG. 16 is a flow diagram of a method of manufacturing a wiring substrate, in accordance with some embodiments.

Referring to FIG. 16, some embodiments of the present disclosure provide a method of manufacturing a wiring substrate, and the method is used for forming the wiring substrate 100 provided in the above embodiments. The method of manufacturing the wiring substrate includes the following steps S1 to S2.

In S1, referring to FIGS. 2A and 2B, conductive layer(s) 130 are formed on a substrate 120; a conductive layer 130 includes a plurality of pad groups 1300, and a pad group 1300 includes a plurality of conductive pads 131.

In S2, referring to FIGS. 2A and 2B, a protective layer 140 is formed on a side of the conductive layer(s) 130 away from the substrate 120, and openings 141 are formed in the protective layer 140; a portion of the conductive layer 130 exposed by an opening 141 is a conductive pad 131; a maximum dimension L1 of the conductive pad 131 in a direction parallel to the substrate 120 is less than or equal to 30 times a minimum distance L2 between an edge of the conductive pad 131 and an edge of the conductive layer 130.

Since L1≤30. L2, the maximum dimension L1 of the conductive pad 131 in the direction parallel to the substrate 120 is relatively small. Thus, the consumption speed of $Pd^{2+}$ in the reaction region in the activation solution may be relatively slow, and the diffusion speed of $Pd^{2+}$ in the solution is relatively slow, which may reduce the speed of depositing the Pd layer on the exposed level difference structure 1101 and the speed of catalyzing the growths of the oxidation prevention layer 170 and the conductive functional layer 180 in a subsequence process, so that the abnormal growth phenomenon is ameliorated or even avoided.

Figure 17:
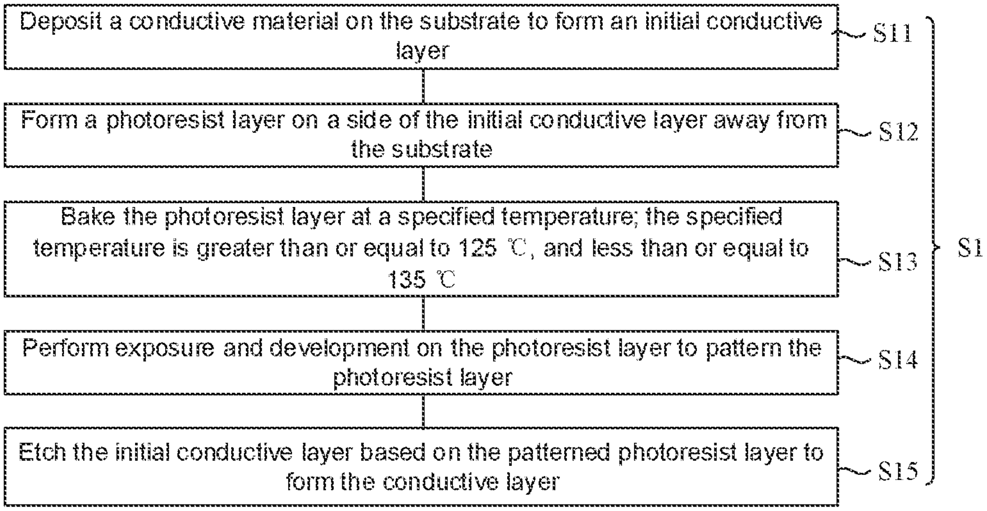
FIG. 17 is a flow diagram of another method of manufacturing a wiring substrate, in accordance with some embodiments.

FIG. 17 is another flow diagram of the method of manufacturing the wiring substrate, in accordance with some embodiments. FIGS. 18 to 22 are diagrams each showing a step of the method of manufacturing the wiring substrate, in accordance with some embodiments.

Referring to FIG. 17, in some embodiments, the step S1 of forming the conductive layer 130 on the substrate 120 includes the following steps S11 to S15.

Figure 18:
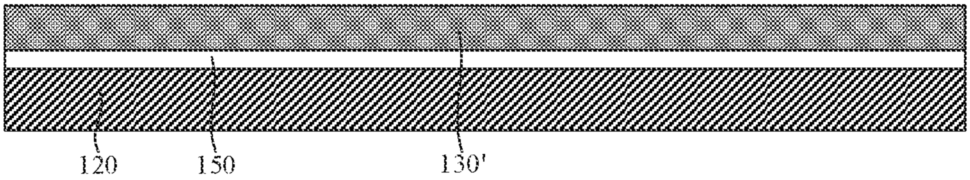
FIG. 18 is a diagram showing a step of a method of manufacturing a wiring substrate, in accordance with some embodiments.

In S11, referring to FIG. 18, a conductive material is deposited on the substrate 120 to form an initial conductive layer 130'.

In the step S11, the initial conductive layer 130' may be formed by using a deposition process.

Referring to FIG. 18, a buffer layer 150 may be formed on a side of the substrate 120 before the initial conductive layer 130' is formed, and the initial conductive layer 130' is formed on a side of the buffer layer 150 away from the substrate 120.

Figure 19:
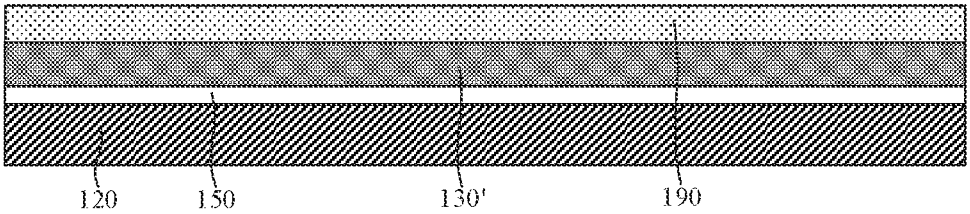
FIG. 19 is a diagram showing another step of a method of manufacturing a wiring substrate, in accordance with some embodiments.

In S12, referring to FIG. 19, a photoresist layer 190 is formed on a side of the initial conductive layer 130' away from the substrate 120.

In S13, the photoresist layer 190 is baked at a specified temperature; the specified temperature is greater than or equal to 125° C., and less than or equal to 135° C.

Figure 20:
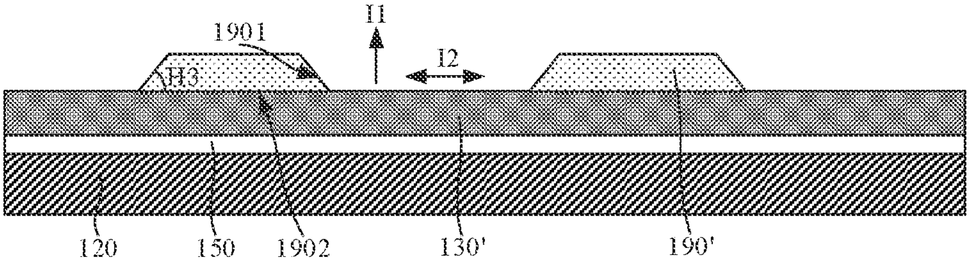
FIG. 20 is a diagram showing yet another step of a method of manufacturing a wiring substrate, in accordance with some embodiments.

In S14, referring to FIG. 20, exposure and development are performed on the photoresist layer 190 to pattern the photoresist layer 190.

Figure 21:
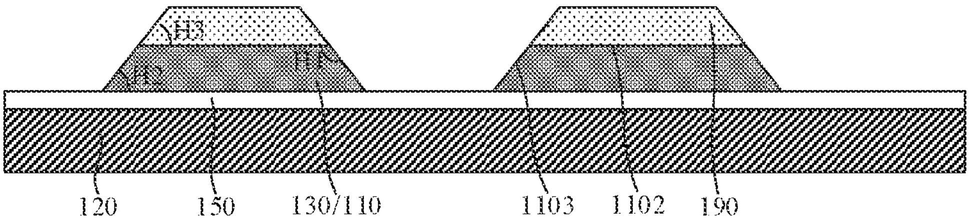
FIG. 21 is a diagram showing yet another step of a method of manufacturing a wiring substrate, in accordance with some embodiments.
Figure 22:
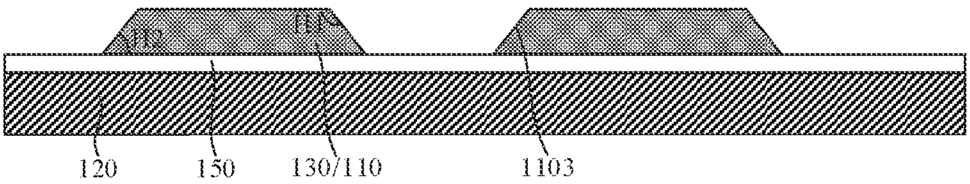
FIG. 22 is a diagram showing yet another step of a method of manufacturing a wiring substrate, in accordance with some embodiments.

In S15, referring to FIG. 21, the initial conductive layer 130' is etched based on the patterned photoresist layer 190 to form the conductive layer 130.

In some examples, the photoresist layer 190 includes positive photoresist. Referring to FIG. 20, in the step S14, after the exposure is performed on the photoresist layer 190, a portion of the photoresist layer 190 (referring to FIG. 19) irradiated by light is removed, so that the photoresist layer 190 may be patterned to form a plurality of photoresist lines 190'.

After the exposure and the development, a section of a photoresist line 190' is in a shape of an isosceles trapezoid. That is, a line width of the photoresist line 190' gradually decreases in a first direction 11. As shown in FIG. 13, a direction indicated by an arrow 11 is the first direction, and a direction indicated by an arrow 12 is a direction of the line width of the photoresist line 190'. A direction from the substrate 120 to the initial conductive layer 130' is the first direction 11. The conductive layer 130 formed in the step S15 includes a plurality of conductive lines 110, and a section of a conductive line 110 is in a shape of an isosceles trapezoid.

In the step S13, the higher the specified temperature, the greater a fluidity of the photoresist layer 190, and thus, as shown in FIG. 20, the less an included angle H3 between a side surface 1901 and a bottom surface 1902 of the photoresist line 190' after the exposure and the development. The bottom surface 1902 of the photoresist line 190' refers to a surface of the photoresist line 190' facing the substrate 120, and the side surface 1901 is connected to the bottom surface 1902.

In the step S15, the initial conductive layer 130' is etched along the side surface 1901 of the photoresist line 190'. Therefore, referring to FIG. 21, an included angle H2 between a side surface 1103 of the conductive line 110 formed in the step S15 and the substrate 120 is approximately equal to the included angle H3.

In the embodiments of the present disclosure, the specified temperature is greater than or equal to 125° C., and less than or equal to 135° C., which may prevent the specified temperature from being too large (e.g., greater than 135° C.), so that the fluidity of the photoresist layer 190 may be relatively large. Thus, after the exposure and the development, the included angle H3 between the side surface 1901 and the bottom surface 1902 of the photoresist line 190' is relatively small, which makes the included angle H2 between the side surface 1103 of the conductive line 110 and the substrate 120 relatively small, so that an effect of the protective layer 140 covering the conductive line 110 may be relatively good. As a result, the conductive line 110 is not prone to be exposed, so that the abnormal growth phenomenon may be ameliorated.

In addition, the included angle H2 between the side surface 1103 of the conductive line 110 and the substrate 120 is complementary to an included angle H1 between a main surface 1102 and the side surface 1103. That is, H1+H2=180°. Therefore, the less the included angle H2, the greater the included angle H1. Therefore, the specified temperature is less than or equal to 135° C., which may make a value of the included angle H1 relatively large, so that an edge of the conductive line 110 is not prone to have a level difference structure. As a result, the effect of the protective layer 140 covering the edge of the conductive line 110 is relatively good, and the edge of the conductive line 110 is not prone to be exposed, so that the abnormal growth phenomenon may be ameliorated.

In addition, it is possible to avoid a problem, due to a too large fluidity of the photoresist layer 190 caused by a fact that the specified temperature is too small (e.g., less than 125° C.), that a process difficulty is relatively high.

In some examples, the specified temperature is equal to 130° C.

In some examples, of the conductive line 110 formed in the step S15, the included angle H1 between the main surface 1102 and the side surface 1103 is greater than or equal to 105°, and less than or equal to 145°.

In addition, the greater a thickness of the photoresist layer 190, the greater the included angle H2 between the side surface 1103 and the substrate 120. For example, in a case where the thickness of the photoresist layer 190 is 7 μm, the included angle H2 is approximately 70°; in a case where the thickness of the photoresist layer 190 is in a range from 3 μm to 4 μm, the included angle H2 is approximately 55°; in a case where the thickness of the photoresist layer 190 is 2 μm, the included angle H2 is approximately 40°.

In addition, the step S1 further includes a step S16 after the step S15. In S16, the photoresist layer 190 is removed.

The step S2 may be performed after the step S16.

In some embodiments, in the step of forming the protective layer 140 on the side of the conductive layer 130 away from the substrate 120, the protective layer 140 is formed by chemical vapor deposition (CVD).

The protective layer 140 formed by CVD has relatively high compactness, which may improve the effect of the protective layer 140 covering the conductive layer 130, so that a problem that the conductive layer 130 is exposed may be ameliorated. As a result, it is possible to ameliorate the abnormal growth phenomenon.

In some other embodiments, the protective layer 140 may be formed by physical vapor deposition (PVD).

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A wiring substrate, comprising:

a substrate;

at least one conductive layer located on a side of the substrate; wherein a conductive layer includes a plurality of pad groups, and a pad group includes a plurality of conductive pads; and a protective layer located on a side of the at least one conductive layer away from the substrate; wherein the protective layer includes a plurality of openings; a portion of the conductive layer exposed by an opening is a conductive pad;

wherein a maximum dimension of the conductive pad in a direction parallel to the substrate is greater than or equal to 1.5 times a minimum distance between an edge of the conductive pad and an edge of the conductive layer, and less than or equal to 30 times the minimum distance between the edge of the conductive pad and the edge of the conductive layer;

wherein the at least one conductive layer includes a plurality of conductive lines, and a portion of a conductive line exposed by the opening is the conductive pad; the conductive line includes a main surface, and a plurality of side surfaces that are each connected to the main surface, and the main surface is a surface of the conductive line away from the substrate; and at least two side surfaces, that each have a small distance to the conductive pad of the conductive line, of the plurality of side surfaces are each a first side surface, and two first side surfaces are connected to each other via a curved surface.

2. The wiring substrate according to claim 1, wherein the maximum dimension of the conductive pad in the direction parallel to the substrate is 0.5 to 5 times a distance between the conductive pad and a conductive pad adjacent thereto.

3. The wiring substrate according to claim 1, wherein the maximum dimension of the conductive pad in the direction parallel to the substrate is greater than or equal to 105 μm, and less than or equal to 350 μm.

4. The wiring substrate according to claim 1, wherein an area of the conductive pad is greater than or equal to 5000 $\mu m^2$, and less than or equal to 55000 $\mu m^2$.

5. The wiring substrate according to claim 1, wherein of a same pad group, a distance between two adjacent conductive pads is greater than or equal to 70 μm, and less than or equal to 214 μm.

6. The wiring substrate according to claim 1, wherein an included angle between the main surface and a side surface of the plurality of side surfaces is greater than or equal to 105°, and less than or equal to 145°.

7. The wiring substrate according to claim 1, wherein an orthographic projection of the curved surface on the substrate is a first rounded corner, and a radius of the first rounded corner is greater than or equal to 20 μm, and less than or equal to 30 μm.

8. The wiring substrate according to claim 1, wherein the wiring substrate comprises a plurality of device regions; wherein the plurality of pad groups include a plurality of first pad groups and a single second pad group that are located in any device region, the first pad groups each include a first electrode pad and a second electrode pad that are spaced apart from each other, and the second pad group includes at least a power supply pad, a grounding pad, an address pad and an output pad that are arranged at intervals;

the wiring substrate comprises a source voltage line and a driving voltage line; wherein the power supply pad is electrically connected to the source voltage line, and the address pad is electrically connected to an output pad in another device region; of the plurality of first pad groups, a first electrode pad of a first first pad group is electrically connected to the driving voltage line, a second electrode pad of a former first pad group is electrically connected to a first electrode pad of a latter first pad group, and a second electrode pad of a last first pad group is electrically connected to the output pad;

wherein a maximum dimension, in the direction parallel to the substrate, of at least a pad of at least the first electrode pad of the first first pad group, the power supply pad and the grounding pad is less than or equal to 30 times a minimum distance between an edge of the pad and the edge of the conductive layer.

9. The wiring substrate according to claim 1, wherein the wiring substrate comprises a plurality of device sub-regions and a single control region;

the plurality of pad groups include first pad groups located in any device sub-region, and the first pad groups each include a first electrode pad and a second electrode pad that are spaced apart from each other;

the plurality of pad groups further include a second pad group located in the control region, and the second pad group includes a power supply pad, a grounding pad, an address pad and an output pad;

the wiring substrate comprises a source voltage line and a driving voltage line; wherein the power supply pad is electrically connected to the source voltage line;

of the first pad groups, a first electrode pad of a first first pad group is electrically connected to the driving voltage line, a second electrode pad of a former first pad group is electrically connected to a first electrode pad of a latter first pad group, and a second electrode pad of a last first pad group is electrically connected to the output pad;

wherein a maximum dimension of at least the first electrode pad of the first first pad group in the direction parallel to the substrate is less than or equal to 30 times a minimum distance between an edge of the first electrode pad and the edge of the conductive layer.

10. The wiring substrate according to claim 1, wherein the at least one conductive layer includes two conductive layers; wherein a first conductive layer is located on the side of the substrate, and a part of the conductive lines are located in the first conductive layer; and a second conductive layer is located on a side of the first conductive layer away from the substrate, and another part of the conductive lines are located in the second conductive layer;

wherein a conductive line in the first conductive layer is connected to at least one conductive line located in the second conductive layer through a via hole, and a portion, exposed by the opening, of a conductive line located in the second conductive layer is the conductive pad.

11. The wiring substrate according to claim 1, further comprising:

an oxidation prevention layer covering a side of the conductive pad away from the substrate; and a conductive functional layer covering a side of the oxidation prevention layer away from the substrate.

12. A backboard, comprising:

a plurality of functional elements;

at least one driving chip; and the wiring substrate according to claim 1; wherein the plurality of pad groups in the wiring substrate include a first pad group and a second pad group, the first pad group is connected to a functional element, and the second pad group is connected to a driving chip.

13. A display apparatus, comprising:

a backlight module; wherein the backlight module is the backboard according to claim 12, and the functional elements each include a light-emitting diode; and a liquid crystal display panel located on a light exit side of the backlight module.

14. A display apparatus, comprising:

a display panel including the backboard according to claim 13.

15. A method of manufacturing a wiring substrate, comprising:

forming a conductive layer on a substrate; wherein the conductive layer includes a plurality of pad groups, and a pad group includes a plurality of conductive pads;

forming a protective layer on a side of the conductive layer away from the substrate; and forming openings in the protective layer; wherein a portion of the conductive layer exposed by an opening is a conductive pad; a maximum dimension of the conductive pad in a direction parallel to the substrate is less than or equal to 30 times a minimum distance between an edge of the conductive pad and an edge of the conductive layer;

wherein the at least one conductive layer includes a plurality of conductive lines, and a portion of a conductive line exposed by the opening is the conductive pad; the conductive line includes a main surface, and a plurality of side surfaces that are each connected to the main surface, and the main surface is a surface of the conductive line away from the substrate; and at least two side surfaces, that each have a small distance to the conductive pad of the conductive line, of the plurality of side surfaces are each a first side surface, and two first side surfaces are connected to each other via a curved surface.

16. The method of manufacturing the wiring substrate according to claim 15, wherein a step of forming the conductive layer on the substrate includes:

depositing a conductive material on the substrate to form an initial conductive layer;

forming a photoresist layer on a side of the initial conductive layer away from the substrate;

baking the photoresist layer at a specified temperature; wherein the specified temperature is greater than or equal to 125° C., and less than or equal to 135° C.;

performing exposure and development on the photoresist layer to pattern the photoresist layer; and etching the initial conductive layer based on the patterned photoresist layer to form the conductive layer.

17. The method of manufacturing the wiring substrate according to claim 15, wherein in a step of forming the protective layer on the side of the conductive layer away from the substrate, the protective layer is formed by chemical vapor deposition.

18. The wiring substrate according to claim 6, wherein the at least one conductive layer includes two conductive layers; wherein a first conductive layer is located on the side of the substrate, and a part of the conductive lines are located in the first conductive layer; and a second conductive layer is located on a side of the first conductive layer away from the substrate, and another part of the conductive lines are located in the second conductive layer;

wherein a conductive line in the first conductive layer is connected to at least one conductive line located in the second conductive layer through a via hole, and a portion, exposed by the opening, of a conductive line located in the second conductive layer is the conductive pad.

19. The method of manufacturing the wiring substrate according to claim 15, wherein the maximum dimension of the conductive pad in the direction parallel to the substrate is greater than or equal to 1.5 times the minimum distance between the edge of the conductive pad and the edge of the conductive layer.

* * * * *